United States Patent
Matsubara

(10) Patent No.: US 10,134,705 B2
(45) Date of Patent: Nov. 20, 2018

(54) METHOD OF MANUFACTURING SEMICONDUCTOR DEVICE

(71) Applicant: Renesas Electronics Corporation, Koutou-ku, Tokyo (JP)

(72) Inventor: Yuko Matsubara, Gunma (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/817,105

(22) Filed: Nov. 17, 2017

(65) Prior Publication Data

US 2018/0182731 A1 Jun. 28, 2018

(30) Foreign Application Priority Data

Dec. 26, 2016 (JP) ................. 2016-251734

(51) Int. Cl.
*H01L 23/495* (2006.01)
*H01L 23/00* (2006.01)
*H01L 21/48* (2006.01)
*H01L 21/56* (2006.01)

(52) U.S. Cl.
CPC .......... *H01L 24/48* (2013.01); *H01L 21/4825* (2013.01); *H01L 21/565* (2013.01); *H01L 23/4952* (2013.01); *H01L 23/49513* (2013.01); *H01L 23/49541* (2013.01); *H01L 24/85* (2013.01); *H01L 2224/48225* (2013.01); *H01L 2224/48463* (2013.01); *H01L 2224/48824* (2013.01); *H01L 2224/85205* (2013.01)

(58) Field of Classification Search
None
See application file for complete search history.

(56) References Cited

U.S. PATENT DOCUMENTS

| 4,920,074 A | 4/1990 | Shimizu et al. |
| 5,838,071 A | 11/1998 | Horibe et al. |
| 6,437,450 B1 * | 8/2002 | Baba ................ H01L 21/563 257/778 |
| 2003/0168253 A1 * | 9/2003 | Khandros ........... H01L 21/6836 174/261 |

(Continued)

FOREIGN PATENT DOCUMENTS

| JP | H02-297949 A | 12/1990 |
| JP | H07-058142 A | 3/1995 |

OTHER PUBLICATIONS

Extended European search report for European Patent Application No. 17203245.0, dated May 23, 2018.

*Primary Examiner* — Whitney T Moore
*Assistant Examiner* — Herve Assouman
(74) *Attorney, Agent, or Firm* — Shapiro, Gabor and Rosenberger, PLLC

(57) ABSTRACT

As one embodiment, a method of manufacturing a semiconductor device includes the following steps. That is, the method of manufacturing a semiconductor device includes a first step of applying ultrasonic waves to a ball portion of a first wire in contact with a first electrode of the semiconductor chip while pressing the ball portion with a first load. In addition, the method of manufacturing a semiconductor device includes a step of, after the first step, applying the ultrasonic waves to the ball portion while pressing the ball portion with a second load larger than the first load, thereby bonding the ball portion and the first electrode.

16 Claims, 23 Drawing Sheets

(56) References Cited

U.S. PATENT DOCUMENTS

| | | |
|---|---|---|
| 2011/0315743 A1 | 12/2011 | Maruya et al. |
| 2012/0286427 A1* | 11/2012 | Sumitomo ............ H01L 24/85 257/738 |
| 2016/0013149 A1 | 1/2016 | Haga et al. |

* cited by examiner

METHOD OF MANUFACTURING SEMICONDUCTOR DEVICE

CROSS-REFERENCE TO RELATED APPLICATION

The present application claims priority from Japanese Patent Application No. 2016-251734 filed on Dec. 26, 2016, the content of which is hereby incorporated by reference into this application.

TECHNICAL FIELD OF THE INVENTION

The present invention relates to a technique of manufacturing a semiconductor device, and to an effective technique applied to a method of manufacturing a semiconductor device including, for example, a process of connecting a metal wire to an electrode pad of a semiconductor chip.

BACKGROUND OF THE INVENTION

Japanese Patent Application Laid-Open Publication No. H02-297949 (Patent Document 1) describes a wire bonding method of applying a load and an ultrasonic wave to a bonding tool in a process of connecting a metal wire to an electrode pad of a semiconductor chip.

In addition, Japanese Patent Application Laid-Open Publication No. H07-58142 (Patent Document 2) describes a wire bonding device applying ultrasonic vibration in thermocompression wire bonding.

SUMMARY OF THE INVENTION

As a method of electrically connecting an external terminal of a semiconductor device and an electrode pad of a semiconductor chip, there is a method of connecting a wire to the electrode pad. As a method of connecting the electrode pad and the wire, there is a ball bonding method in which a ball portion is formed at a tip of the wire and the ball portion is then pressure-bonded onto the electrode pad. When the wire and the electrode pad are connected by the ball bonding method, stress is applied to a member provided on a periphery of the electrode pad among constituent members of the semiconductor chip. Therefore, from the viewpoint of preventing damage to the electrode pad itself or the members provided on the periphery of the electrode pad and improving reliability, a technique of reducing the stress applied to the electrode pad is needed when the ball portion is pressure-bonded.

Other objects and novel characteristics of the present invention will be apparent from the description of the present specification and the accompanying drawings.

As one embodiment, a method of manufacturing a semiconductor device includes the following steps. That is, the method of manufacturing a semiconductor device includes a first step of applying ultrasonic waves to a ball portion of a first wire in contact with a first electrode of a semiconductor chip while pressing the ball portion with a first load. In addition, the method of manufacturing a semiconductor device includes a step of, after the first step, applying the ultrasonic waves to the ball portion while pressing the ball portion with a second load larger than the first load, thereby bonding the ball portion and the first electrode.

According to the one embodiment described above, reliability of a semiconductor device can be improved.

BRIEF DESCRIPTIONS OF THE DRAWINGS

Figure 1:
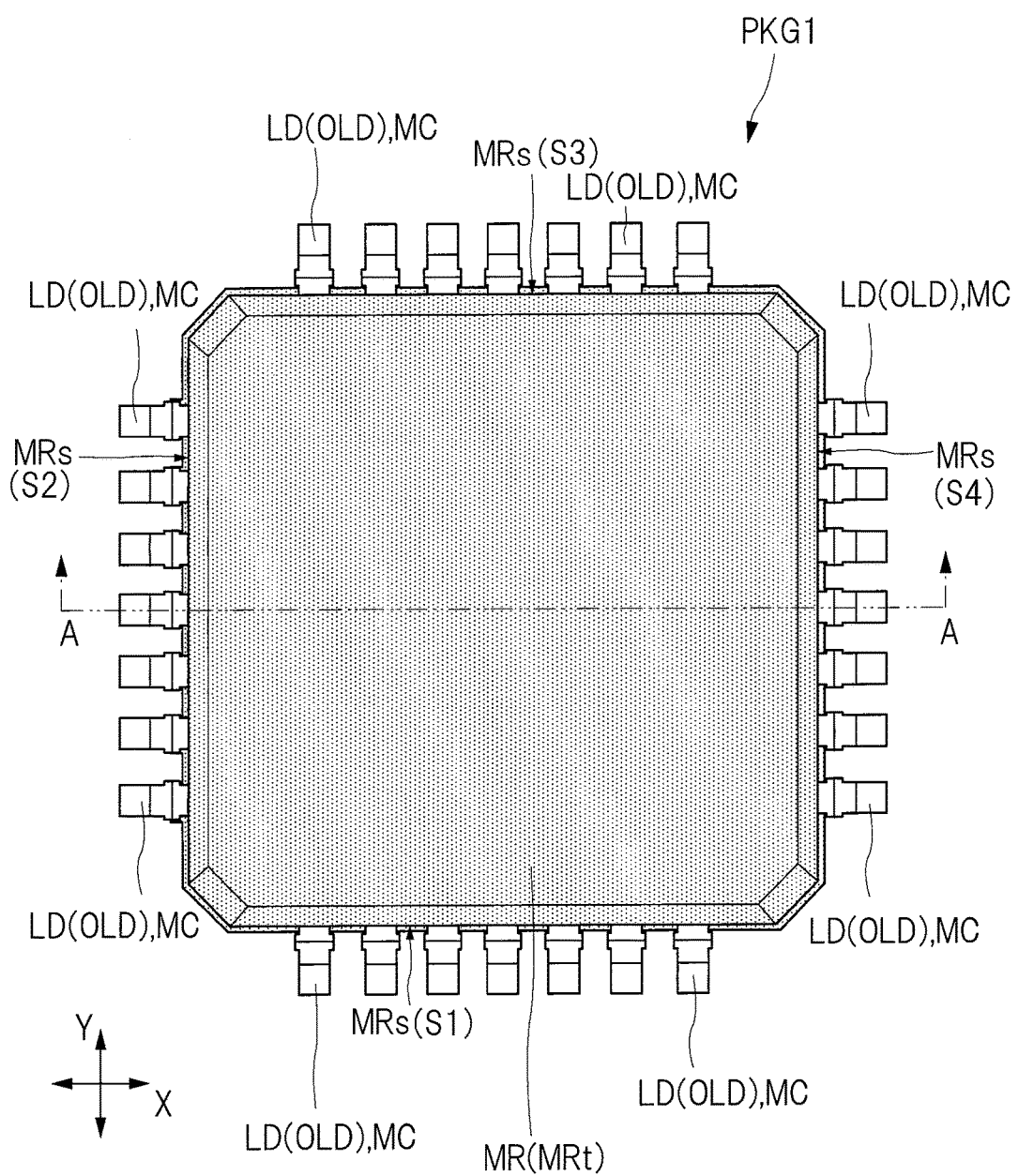
FIG. 1 is a top view of a semiconductor device according to one embodiment.

DESCRIPTIONS OF THE PREFERRED EMBODIMENTS (Description of Description Form, Basic Terms, and Method in Present Application)

In this application, the embodiment will be described in a plurality of sections or the like when required as a matter of convenience. However, these sections are not independent or distinct from each other unless particularly explicitly described otherwise, and they are individual parts of a single example, one of them is a partial detail of the other, or one of them is a modification or the like of part or the whole of the other, irrespective of the order of descriptions. Also, the description of the same portions is not repeated in principle. Further, each component in the embodiment is not indispensable unless particularly explicitly described otherwise, unless the component is logically limited to a specific number, and unless it is obvious from the context that the component is indispensable.

Similarly, in the description of the embodiment and others, even when "X made up of A" or the like is referred to with respect to a material, a composition, and the like, X containing elements other than A is not excluded unless particularly explicitly described otherwise and unless it is obvious from the context that X does not contain elements other than A. For example, when referring to an ingredient, it means "X containing A as a main component" or the like. For example, even when "silicon member" or the like is mentioned, the meaning is not limited to pure silicon, and it is needless to say that a member containing a SiGe (silicon-germanium) alloy, another multi-element alloy containing silicon as a main component, another additive, or the like is also included. In addition, even when a gold plating, a Cu layer, a nickel plating and others are mentioned, not only a pure one but also a member containing each of gold, Cu and nickel as a main component is included unless particularly explicitly described otherwise.

Further, even when a specific value or amount is mentioned, a value larger than a specific value or smaller than the specific value is also applicable unless particularly explicitly described otherwise, unless it is logically limited to the specific value, and unless it is obvious from the context that a value is not larger than the specific value or smaller than the specific value.

Also, the same or similar portions are denoted by the same or similar reference signs or characters throughout the drawings for describing the embodiment, and the repetitive description thereof is omitted.

In addition, in the accompanying drawings, hatching may be omitted even in a cross section in the case where the drawings become rather complicated or distinction from a clearance is apparent. In association with this, when it is obvious from the description or the like, a contour line in a background may be omitted even in a case of a planarly closed hole. In addition, in order to specify the fact that a portion is not a clearance or specify a boundary of regions, hatching or dot pattern may be given even in the case other than the cross section.

<Semiconductor Device>

Figure 2:
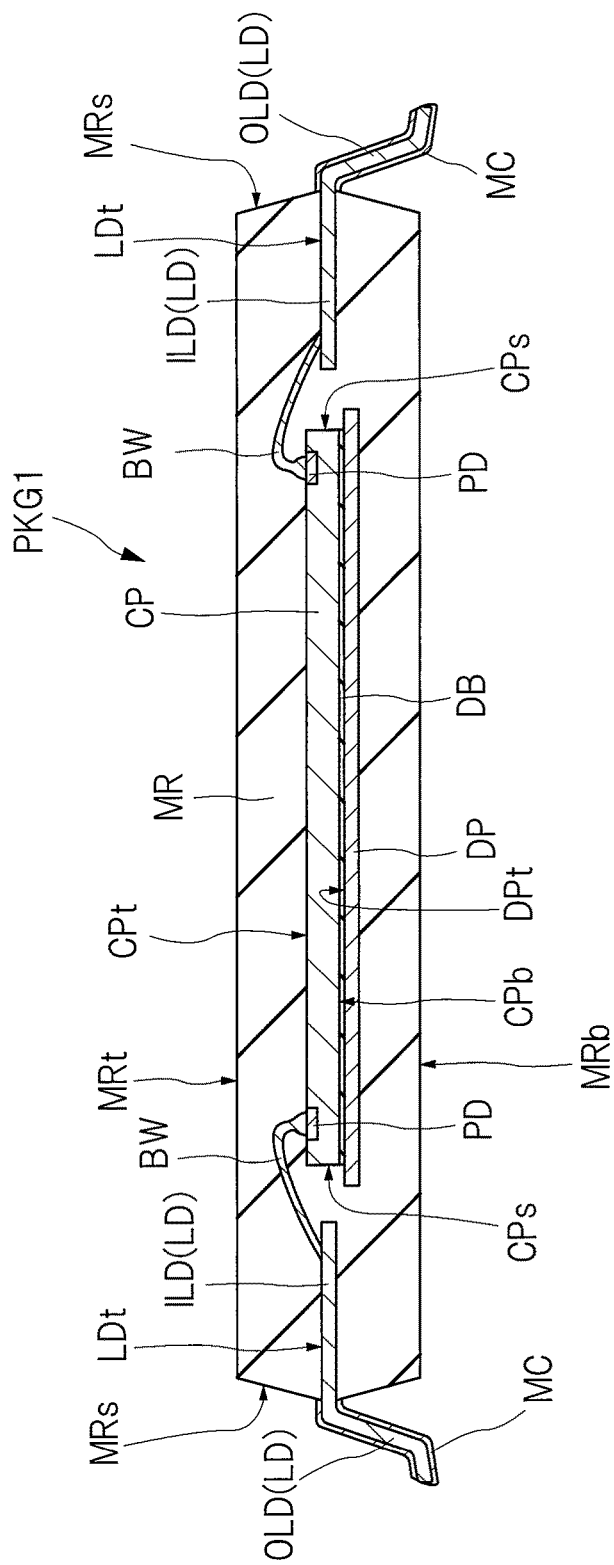
FIG. 2 is a cross-sectional view taken along a line A-A of FIG. 1.

First, an outline of a configuration of a semiconductor device PKG1 of the present embodiment will be described with reference to FIGS. 1 to 4. FIG. 1 is a top view of a semiconductor device according to the present embodiment. Also, FIG. 2 is a cross-sectional view taken along a line A-A of FIG. 1. Also, FIG. 3 is a plan view illustrating an internal structure of the semiconductor device in a state seen through a sealing body illustrated in FIG. 1.

A technique described in the following embodiment can be widely applied to a semiconductor device in which a wire being a metal wire is connected to an electrode pad exposed in a front surface of a semiconductor chip. In the present embodiment, a lead-frame type semiconductor device will be described as an example of a semiconductor device in which a wire is connected to an electrode pad of a semiconductor chip. In the case of the lead-frame type semiconductor device, a semiconductor chip mounted over a die pad of a lead frame and each of a plurality of leads disposed on a periphery of the die pad are electrically connected with each other via a wire.

Figure 3:
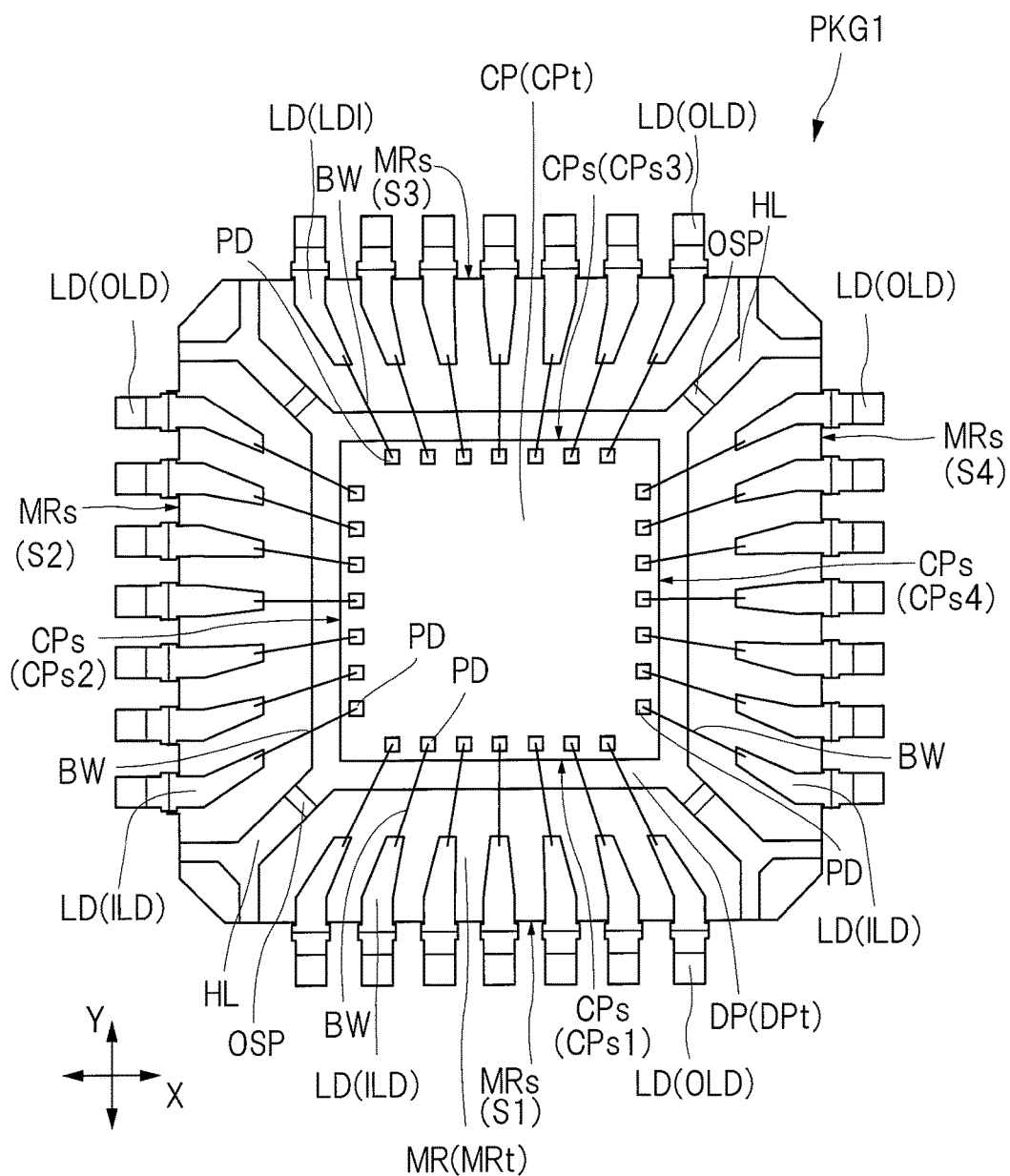
FIG. 3 is a plan view illustrating an internal structure of the semiconductor device in a state seen through a sealing body illustrated in FIG. 1.

As illustrated in FIGS. 1 to 3, the semiconductor device PKG1 includes a semiconductor chip CP (see FIGS. 2 and 3), a plurality of leads (terminals, external terminals) LD being external terminals disposed on a periphery of the semiconductor chip CP, and a plurality of wires BW (see FIGS. 2 and 3) being conductive members electrically connecting the semiconductor chip CP and the plurality of leads LD. In addition, the semiconductor chip CP and the plurality of wires BW are sealed in a sealing body (resin body) MR. In addition, an inner lead portion ILD (see FIGS. 2 and 3) of each of the plurality of leads LD is sealed in the sealing body MR, and an outer lead portion OLD of each of the plurality of leads LD is exposed from the sealing body MR.

As illustrated in FIG. 1, a planar shape of the sealing body MR included in the semiconductor device PKG1 is a quadrangle. The sealing body MR includes an upper surface MRt, a lower surface (back surface, mounted surface) MRb (see FIG. 2) on a side opposite to the upper surface MRt, and a plurality of (four in FIG. 1) side surfaces MRs positioned between the upper surface MRt and the lower surface MRb.

In a plan view, the sealing body MR includes a side (main side) S1 extending in an X direction, a side (main side) S2 extending along a Y direction crossing (orthogonal to) the X direction, a side (main side) S3 positioned on a side opposite to the side S1, and a side (main side) S4 positioned on a side opposite to the side S2. Then, the four side surfaces MRs of the sealing body MR are disposed along each side of the sealing body MR.

In addition, in the semiconductor device PKG1, the plurality of leads LD are disposed along each of the four sides (main sides) S1, S2, S3, and S4 of the sealing body MR having a quadrangular planar shape. The plurality of leads LD are made of metal, and are metal members containing, for example, copper (Cu) as a main component in the present embodiment. As in the present embodiment, a semiconductor package in which the plurality of leads LD are arrayed along each of the four sides of the sealing body MR is called a quad flat package (QFP). In addition, although not illustrated, a semiconductor package in which the plurality of leads LD are arrayed along two sides positioned opposite to each other and the leads LD are not arrayed on the other two sides among the four sides of the sealing body MR is called small outline package (SOP). In the present embodiment, a mode applied to a semiconductor device PKG1 being a QFP will be described, but the mode may be applied to a semiconductor device being an SOP as a modification.

As illustrated in FIG. 2, the outer lead portions OLD of the plurality of leads LD protrude toward the outside of the sealing body MR on the side surfaces MRs of the sealing body MR, respectively. In the case of the QFP and the SOP, the outer lead portion OLD protrudes from the side surface MRs of the sealing body MR and has a shape bent toward the mounting surface side. Note that, although not illustrated, as a modification of the semiconductor device PKG1, there is also a semiconductor package in which each of the plurality of leads LD is exposed on the lower surface MRb of the sealing body MR. A semiconductor package in which the lead LD is exposed on the lower surface MRb of the sealing body MR includes a quad flat non-leaded package (QFN) and a small outline non-leaded package (SON).

In addition, on the exposed surface of the outer lead portion OLD of each of the plurality of leads LD, a metal film (exterior plating film) MC is formed over a front surface of a base material containing, for example, copper as a main component. The metal film MC is made of a metallic material such as solder having better wettability to solder than copper of the base material, and is a metal film covering the front surface of the copper member of the base material. Forming the metal film MC over the outer lead portion OLD of the lead LD being the external terminal of the semiconductor device PKG1 makes it easier to mount the semiconductor device PKG1 when the semiconductor device PKG1 is mounted on a mounting board (not illustrated). Specifically, when each of the outer lead portions OLD is connected to a terminal (not illustrated) of the mounting board, the outer lead portion OLD is connected to the terminal via a conductive connection material such as a solder material. At this time, when the outer lead portion OLD is covered with the metal film MC, the wettability to the solder material as the above-described connection material improves. Thus, since a bonding area between the plurality of leads LD and the solder material increases, bonding strength between the plurality of leads LD and the terminals on a mounting board side can be improved.

In the example illustrated in FIG. 2, an example in which a metal film MC being a solder film is formed on the exposed surface of the outer lead portion OLD of the lead LD by plating is illustrated. The metal film MC has various modifications. For example, the metal film MC may be a layered film of a metal film containing nickel (Ni) as a main component and a metal film containing palladium (Pd) as a main component. Alternatively, for example, a metal film containing gold (Au) as a main component may be further layered over a front surface of the metal film containing palladium as a main component. In addition, when the metal film MC is made of a material other than solder, the metal film MC may be formed in such a manner as to cover respective front surfaces of the inner lead portion ILD and the outer lead portion OLD of each of the plurality of leads LD.

In addition, as illustrated in FIGS. 2 and 3, a semiconductor chip CP is sealed inside the sealing body MR. As illustrated in FIG. 3, the semiconductor chip CP forms a quadrangle in a plan view, and has a front surface (upper surface, main surface) CPt, a back surface CPb (see FIG. 2) on a side opposite to the front surface CPt, and a side surface CPs positioned between the front surface CPt and the back surface CPb in a cross-sectional view in a thickness direction of the semiconductor chip CP. In the front surface CPt of the semiconductor chip CP, a plurality of pads (bonding pads) PD are provided along each of the four sides constituting an outer edge of the front surface CPt. In addition, the semiconductor chip CP (more specifically, the semiconductor substrate) is made of, for example, silicon (Si). Although not illustrated, a plurality of semiconductor elements (circuit elements) are formed in the main surface of the semiconductor chip CP (more specifically, a semiconductor element formation region provided in the upper surface of the semiconductor substrate of the semiconductor chip CP). Then, the plurality of pads PD are electrically connected with the semiconductor elements via wirings (not illustrated) formed in the wiring layer disposed inside the semiconductor chip CP (more specifically, between the front surface CPt and the semiconductor element formation region not illustrated). In other words, the plurality of pads PD are electrically connected with a circuit formed in the semiconductor chip CP.

In addition, over the front surface CPt of the semiconductor chip CP, an insulating film covering the substrate and the wirings of the semiconductor chip CP is formed, and a front surface of each of the plurality of pads PD is exposed from the insulating film in the opening formed in the insulating film. In addition, the pad PD is made of metal, and in the present embodiment, the pad PD is made of, for example, aluminum (Al).

The semiconductor chip CP is mounted over the die pad DP being a chip mounting portion. In the case of the semiconductor device PKG1, as illustrated in FIG. 3, in a plan view, a die pad (chip mounting portion) DP being a chip mounting portion over which the semiconductor chip CP is mounted is disposed between the sides S1 and S3, and between the sides S2 and S4 of the sealing body MR, and the semiconductor chip CP is mounted over an upper surface (front surface, main surface, chip mounting surface) DPt of the die pad DP. The upper surface DPt of the die pad DP is formed of a quadrangle whose plane area is larger than a surface area of the semiconductor chip CP. However, the die pad DP is a support member supporting the semiconductor chip CP, and various modifications besides the example illustrated in FIG. 3 can be applied to a shape and a size. For example, the planar shape of the die pad DP may be a circle. In addition, for example, the plane area of the die pad DP may be smaller than the front surface CPt of the semiconductor chip CP. In addition, in the case of the semiconductor device PKG1, the die pad DP is sealed in the sealing body MR. Note that, although not illustrated, as a modification of the semiconductor device PKG1, a lower surface of the die pad DP may be exposed from the sealing body MR on the lower surface MRb of the sealing body MR.

In addition, as illustrated in FIG. 2, the semiconductor chip CP is mounted over the die pad DP via a die bonding material (adhesive material) DB with the back surface CPb facing the upper surface DPt of the die pad DP. That is, the semiconductor chip CP is mounted by a so-called face-up mounting method for causing the surface (back surface CPb) opposite to the front surface (main surface) CPt in which a plurality of pads PD are formed to face the chip mounting surface (upper surface DPt). The die bonding material DB is an adhesive material used in die bonding the semiconductor chip CP, and is a conductive resin adhesive material obtained by containing a plurality of (a large number of) conductive particles (for example, silver particles) in an epoxy thermosetting resin, for example, or a solder material.

A plurality of leads LD are disposed on the periphery of the semiconductor chip CP (in other words, on the periphery of the die pad DP). A plurality of pads (electrodes, electrode pads) PD exposed in the front surface CPt of the semiconductor chip CP are electrically connected with the respective inner lead portions ILD of the plurality of leads LD positioned inside the sealing body MR via the plurality of wires (conductive members) BW. One end of the wire BW (a ball portion BWb illustrated in FIG. 14 described below) is bonded to the pad PD, and the other end is bonded to a part of the inner lead portion ILD (wire bonding region).

The wire BW of the present embodiment is made of, for example, copper (Cu). Generally, the wire connected to the electrode pad of the semiconductor chip is often formed of gold, but may be formed of a material other than gold from the viewpoint of reducing material costs or from the viewpoint of reducing an impedance component of a transmission path formed with the wire. For example, as in the present embodiment, if the wire BW is made of copper, the material costs can be reduced.

In addition, forming the wire BW with copper having higher electrical conductivity than gold allows the impedance component of the transmission path formed with the wire BW to be reduced. In addition, as a modification of the present embodiment, a front surface of the base material made of copper may be covered with a metal film made of palladium (Pd). In this case, bonding strength between the wire BW and the pad PD can be further improved.

In addition, as illustrated in FIG. 3, a plurality of suspension leads HL are disposed on the periphery of the die pad DP. The suspension lead HL is a member causing the supporting portion (frame portion) of the lead frame to support the die pad DP in the manufacturing process of the semiconductor device PKG1.

In addition, in the present embodiment, the upper surface DPt of the die pad DP and an upper surface of the inner lead portion ILD of the lead LD are disposed at different heights. In the example illustrated in FIG. 2, a position of the upper surface DPt of the die pad DP is disposed lower than a position of the upper surface LDt of the inner lead portion ILD. For this reason, the plurality of suspension leads HL illustrated in FIG. 3 are provided with respective offset portions (downset portions in the example of the present embodiment) OSP, which are bent in such a manner that a height of the upper surface DPt of the die pad DP is different from a height of the upper surface LDt (see FIG. 2) of the inner lead portion ILD of the lead LD.

<Semiconductor Chip>

Figure 4:
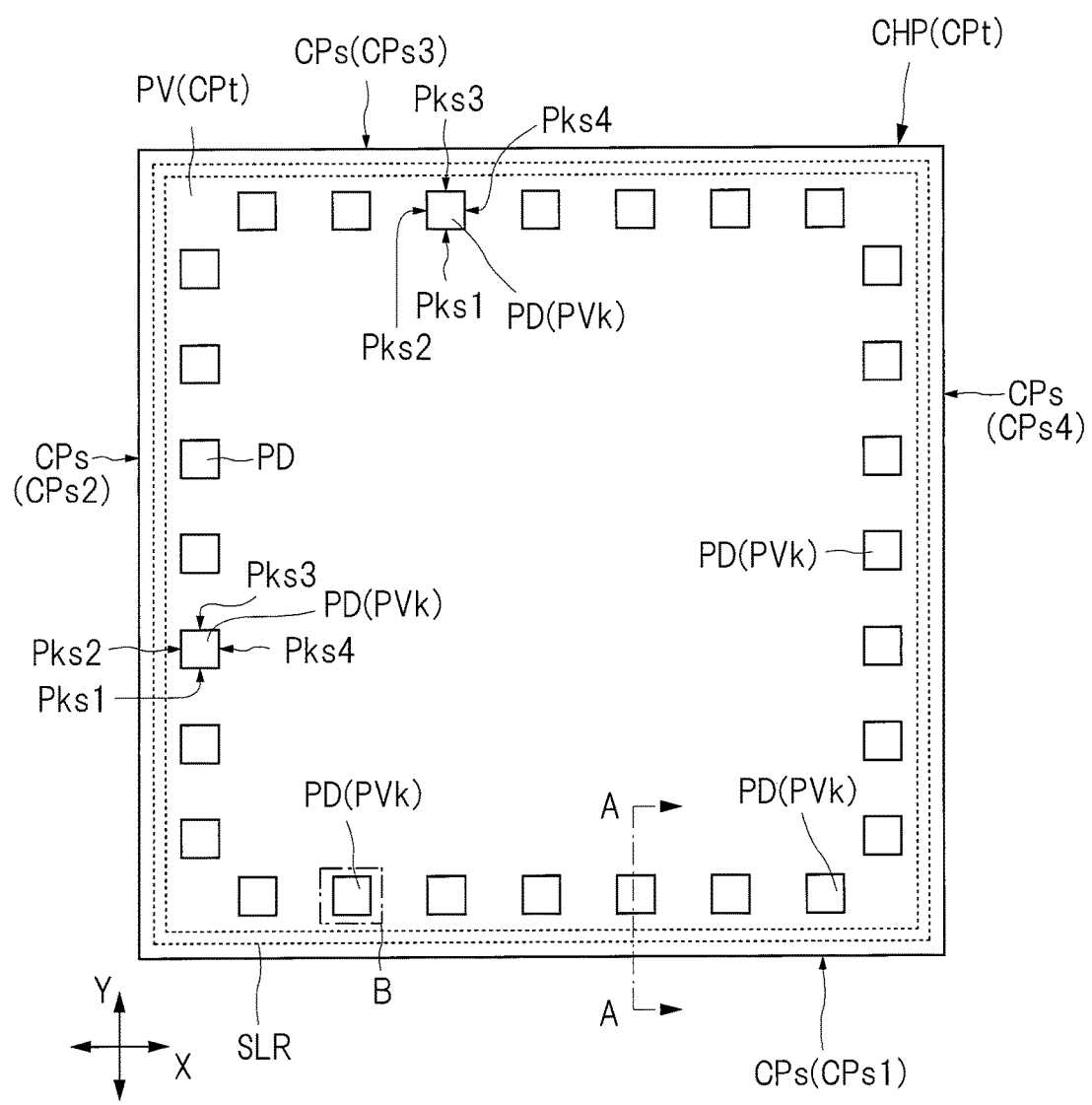
FIG. 4 is a plan view of a semiconductor chip illustrated in FIG. 3.
Figure 5:
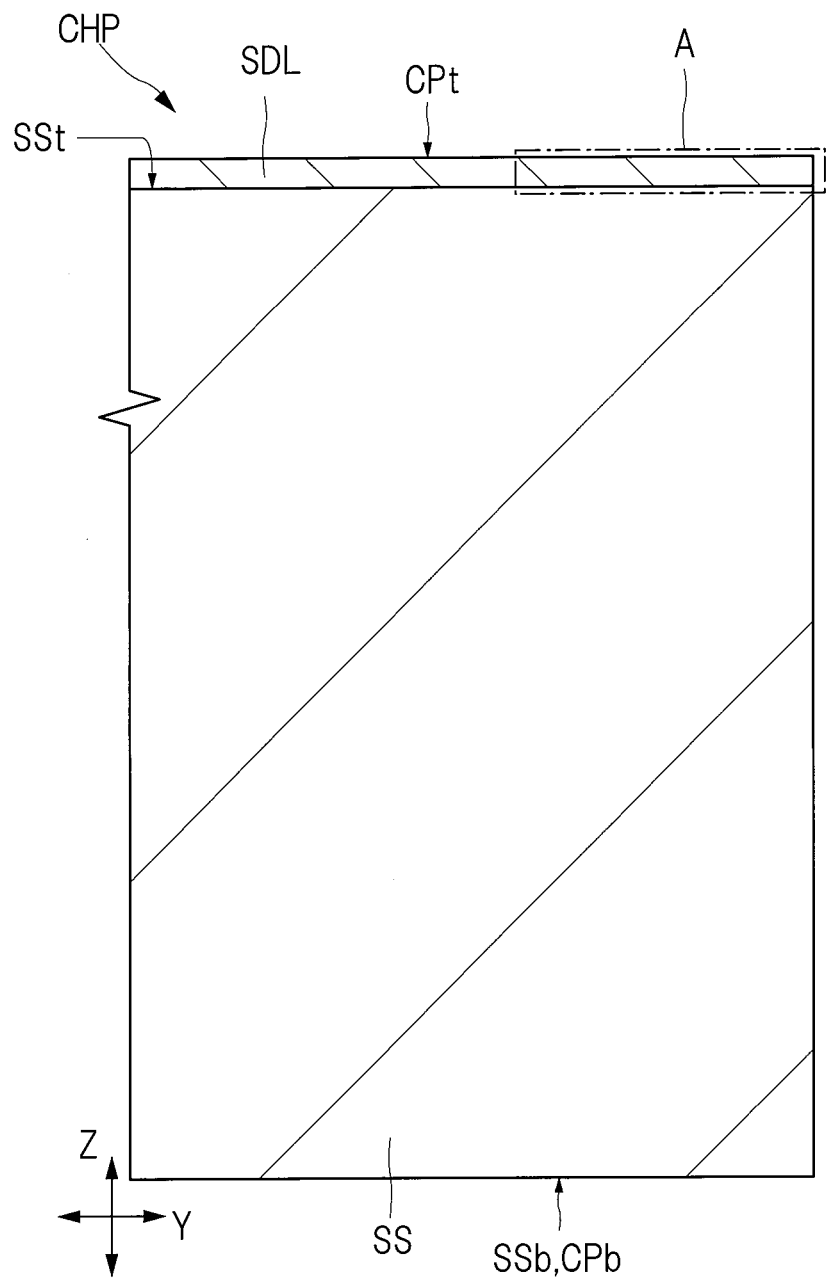
FIG. 5 is an enlarged cross-sectional view taken along a line A-A of FIG. 4.

Next, a semiconductor chip illustrated in FIGS. 2 and 3 will be described. FIG. 4 is a plan view of the semiconductor chip illustrated in FIG. 3. Also, FIG. 5 is an enlarged cross-sectional view taken along a line A-A of FIG. 4. Also, FIG. 6 is a further enlarged cross-sectional view of a portion A in FIG. 5.

Figure 6:
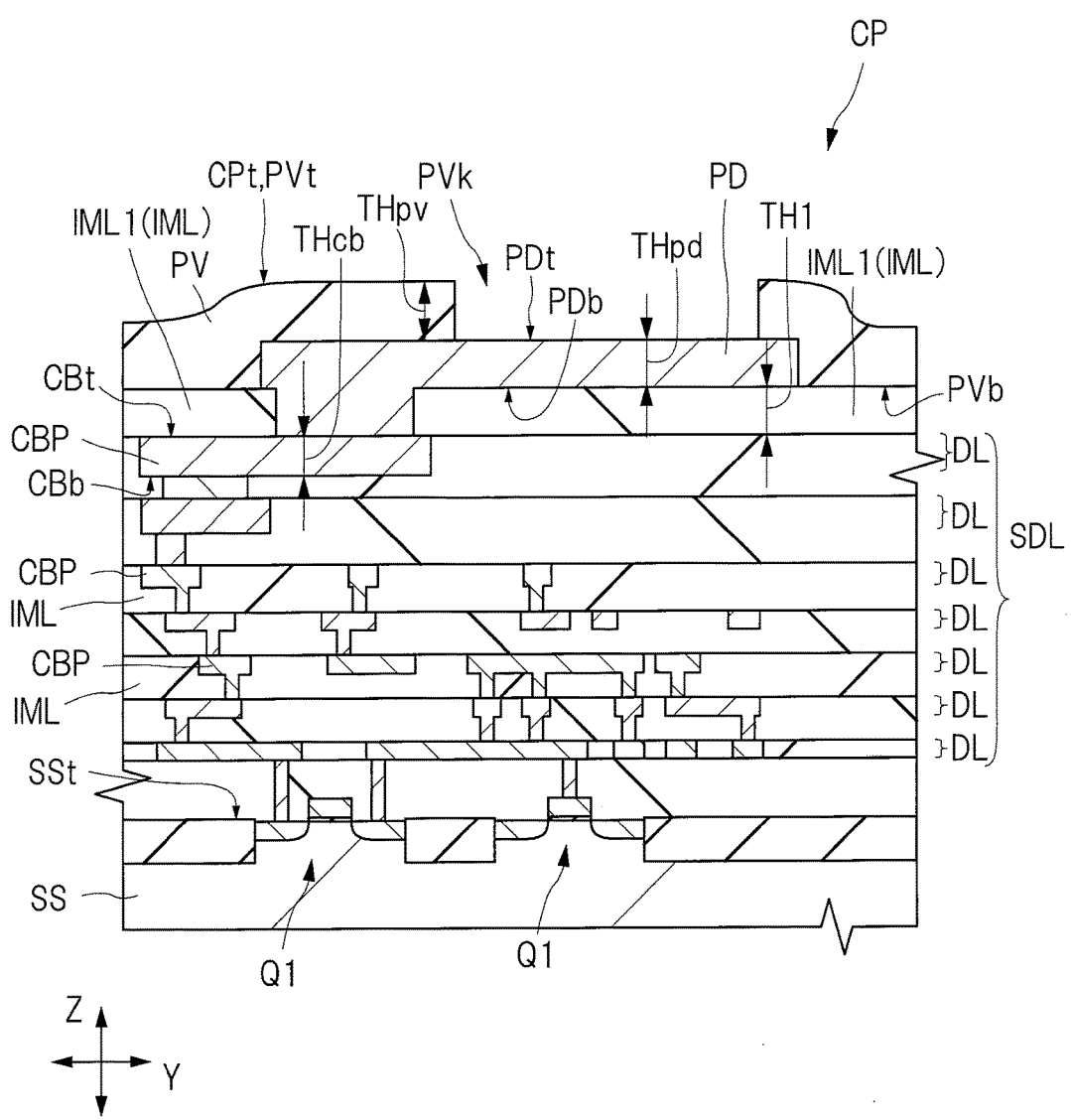
FIG. 6 is a further enlarged cross-sectional view of a portion A in FIG. 5.

Note that FIGS. 4 to 6 each illustrate a state before the wire BW is connected to the pad PD illustrated in FIG. 3. In addition, FIG. 6 illustrates an example in which seven wiring layers DL are layered between a layer in which the pad PD is formed and a semiconductor substrate SS as an example of the wiring portion SDL. However, the layered number of the wiring layers is not limited to eight layers, and there are various modifications in which the layered number of the wiring layers is six or less, or eight or more, for example. In addition, in the example illustrated in FIG. 6, an example of a structure of a metal oxide semiconductor field effect transistor (MOSFET) is described as an example of a plurality of semiconductor elements Q1 formed in an upper surface SSt of the semiconductor substrate SS. However, the structure of the semiconductor element Q1 includes various modifications besides the MOSFET.

As illustrated in FIGS. 4 and 6, in the semiconductor chip CP, an insulation film (protective film, protective insulating film) PV, and the pad PD exposed from the insulating film PV in the opening PVk formed in the insulating film PV are formed in the front surface (upper surface, main surface) CPt. A plurality of openings PVk are formed in the insulating film PV, and the pad PD is exposed in each of the plurality of openings PVk. In other words, the semiconductor chip CP includes a plurality of pads PD exposed from the insulating film PV in the front surface CPt.

In addition, the front surface CPt of the semiconductor chip CP forms a quadrangle in a plan view, and has a side CPs1 extending in the X direction, a side CPs2 extending along the Y direction crossing (orthogonal to) the X direction, a side CPs3 positioned on a side opposite to the side CPs1, and a side CPs4 positioned on a side opposite to the side CPs2. As illustrated in FIG. 3, in the present embodiment, the side CPs1 of the semiconductor chip CP is disposed along the side S1 of the sealing body MR, and the side CPs2 of the semiconductor chip CP is disposed along the side S2 of the sealing body MR. In addition, the side CPs3 of the semiconductor chip CP is disposed along the side S3 of the sealing body MR, and the side CPs4 of the semiconductor chip CP is disposed along the side S4 of the sealing body MR.

In addition, each of the plurality of openings PVk formed in the insulating film PV has a plurality of sides. In the example illustrated in FIG. 4, an opening shape of the opening PVk has a side Pks1 extending in the X direction, a side Pks2 extending along the Y direction crossing (orthogonal to) the X direction, a side Pks3 positioned on a side opposite to the side Pks1, and a side Pks4 positioned on a side opposite to the side Pks2. In the present embodiment, the side Pks1 of the opening PVk is disposed along the side CPs1 of the semiconductor chip CP, and the side Pks2 of the opening PVk is disposed along the side CPs2 of the semiconductor chip CP. In addition, the side Pks3 of the opening PVk is disposed along the side CPs3 of the semiconductor chip CP, and the side Pks4 of the opening PVk is disposed along the side CPs4 of the semiconductor chip CP.

In addition, the semiconductor chip CP includes a semiconductor substrate SS having the upper surface (semiconductor element formation surface) SSt in which the plurality of semiconductor elements Q1 (see FIG. 6) are formed and a lower surface (back surface) SSb (see FIG. 5) on a side opposite to the upper surface SSt. The semiconductor substrate SS is a base material of the semiconductor chip CP, and is made of, for example, silicon (Si) as a main component. In addition, the semiconductor chip CP includes the wiring portion SDL (see FIGS. 5 and 6) formed over the upper surface SSt of the semiconductor substrate SS.

In the example illustrated in FIG. 5, the back surface (lower surface) CPb of the semiconductor chip CP is the same surface as the lower surface SSb of the semiconductor substrate SS. In other words, in the example illustrated in FIG. 5, the lower surface SSb of the semiconductor substrate SS is the back surface CPb of the semiconductor chip CP. In addition, the front surface (main surface, upper surface) CPt of the semiconductor chip CP includes an upper surface PVt of the insulating film PV (see FIGS. 4 and 6) formed in such a manner as to cover an uppermost layer of the wiring portion SDL, and an exposed surface of the plurality of pads PD exposed from the insulating film PV (see FIGS. 4 and 6).

In addition, as illustrated in the enlarged view in FIG. 6, the wiring portion SDL includes the plurality of wiring layers DL to be layered. In the wiring portion SDL, the plurality of semiconductor elements Q1 and the plurality of pads PD are electrically connected with each other via the plurality of wiring layers DL being layered. The plurality of pads PD are formed on the insulating layer IML1 formed in such a manner as to cover the uppermost layer of the wiring portion SDL. Furthermore, the pad PD is electrically connected with the uppermost wiring layer DL via a via wiring (a part of the wiring constituting the pad PD) positioned in the opening provided in the insulating layer IML1.

Each of the plurality of wiring layers DL includes a plurality of conductor patterns (wirings) CBP and an insulating layer IML electrically insulating the plurality of conductor patterns CBP. The conductor pattern CBP is embedded in the opening formed in the insulating layer IML. In addition, the conductor pattern CBP of each wiring layer DL is electrically connected with a conductor pattern CBP of a wiring layer DL adjacent to the wiring layer DL in which the conductor pattern CBP is formed. For example, the conductor pattern CBP formed in the third wiring layer DL counted from the upper surface SSt side of the semiconductor substrate SS is electrically connected with each of the conductor pattern CBP formed in the second wiring layer DL and the conductor pattern CBP formed in the fourth wiring layer DL. In addition, the conductor pattern CBP formed in the first wiring layer DL is electrically connected with a gate electrode, a source region, or a drain region of the semiconductor element Q1. In addition, the conductor pattern CBP formed in the wiring layer DL of the uppermost layer (the seventh layer in FIG. 6) and the pad PD are electrically connected with each other. In the wiring portion SDL, electrically connecting the conductor patterns CBP formed in the plurality of wiring layers DL with one another forms a conduction path for electrically connecting the semiconductor element Q1 and the pad PD.

The material constituting the wiring portion SDL is not limited to the following, and can be exemplified as follows. The insulating layer IML contains, for example, silicon oxide ($SiO_2$) as a main component. In addition, the plurality of conductor patterns CBP formed in the wiring layer DL other than the uppermost layer contain, for example, copper (Cu) as a main component. In addition, the uppermost wiring layer DL is formed of the same metallic material as the pad PD, for example, a metallic material containing aluminum as a main component. The pad PD is formed over the conductor pattern CBP in the uppermost layer with the insulating layer IML1 interposed therebetween. In other words, the insulating layer IML1 is interposed between the wiring layer DL in the uppermost layer and the pad PD. The insulating layer IML1 is a layer covering the wiring layer DL in the uppermost layer. As illustrated in FIG. 6, the insulating layer IML1 is interposed between the pad PD and the conductor pattern CBP, and an opening is formed in a part of the insulating layer IML1. The pad PD and the conductor pattern CBP are in close contact with each other in the opening thereof. In this case, a current flowing between the pad PD and the conductor pattern CBP flows through the part where the pad PD and the conductor pattern CBP are in close contact with each other.

In addition, the wiring layer DL in the uppermost layer and the plurality of pads PD are covered with the insulating film PV having the front surface CPt of the semiconductor chip CP. Providing the insulating film PV in such a manner as to cover the wiring portion SDL allows the wiring portion SDL to be protected. The insulating film PV has a lower surface (surface) PVb facing the upper surface SSt of the semiconductor substrate SS and the upper surface (surface) PVt on a side opposite to the lower surface PVb since the insulating film PV is a film covering the wiring portion SDL.

Note that, as illustrated in FIG. 6, since the insulating film PV is a film covering the wiring portion SDL, a wiring portion SDL in which a plurality of wiring layers DL are layered is interposed between the lower surface PVb of the insulating film PV and the upper surface SSt of the semiconductor substrate SS.

The insulating film PV is made of, for example, silicon oxide ($SiO_2$), silicon nitride (SiN), silicon oxynitride (SiON), or a layered film thereof. In addition, a resin film of polyimide or the like may be formed in such a manner as to further cover the film of silicon oxide, silicon nitride, or silicon oxynitride. In the example illustrated in FIG. 4, the insulating film PV made of a single-layer insulating film is illustrated as the simplest example, but as a modification, there is also an insulating film PV made of a layered film. In the case of the insulating film PV made of a layered film, a lower surface of the insulating film in the lowermost layer (the layer closest to the wiring layer DL) corresponds to the lower surface PVb of the insulating film PV. In addition, in the case of the insulating film PV made of a layered film, an upper surface of the insulating film in the uppermost layer (the layer farthest from the wiring layer DL) corresponds to the upper surface PVt of the insulating film PV.

In addition, as illustrated in FIG. 6, the plurality of pads PD of the semiconductor chip CP are formed between the insulating film PV and the semiconductor substrate SS and are exposed from the insulating film PV in the front surface CPt of the semiconductor chip CP. Specifically, as illustrated in FIG. 6, in the insulating film PV, the opening PVk is formed at a position overlapping with the pad PD in a thickness direction (Z direction in FIG. 6). The opening PVk is formed in such a manner as to penetrate from one to the other of the upper surface PVt and the lower surface PVb of the insulating film PV. Therefore, the plurality of pads PD are exposed from the insulating film PV at the positions overlapping with the plurality of openings PVk formed in the insulating film PV. In the example illustrated in FIG. 6, a part of the pad PD is exposed from the insulating film PV. This allows a conductive member such as the wire BW illustrated in FIGS. 2 and 3 to be connected to each of the plurality of pads PD. In other words, the plurality of pads PD can be used as external terminals of the semiconductor chip CP. The surface of the pad PD exposed from the insulating film PV in the opening PVk is a bonding surface PDt to which the wire BW is bonded.

Meanwhile, various thermal stresses such as a temperature cyclic load are applied to the semiconductor chip CP illustrated in FIG. 6 during the manufacturing process of the semiconductor device PKG1 (see FIG. 2) or after completion of the semiconductor device PKG1. At this time, a linear expansion coefficient of the pad PD made of metallic materials is larger than a linear expansion coefficient of each of the insulating film PV covering a part (peripheral portion) of the pad PD or the sealing body MR (see FIG. 2) sealing the pad PD together with the wire BW (see FIG. 2). Therefore, on the periphery of the pad PD, due to the difference in linear expansion coefficient, shear stress (stress acting on a surface in such a way to slide in a direction parallel to a certain surface inside the object) occurs along an extending direction of the bonding surface PDt of the pad PD. Since the shear stress acts on the front surface PDt of the pad PD along the horizontal direction, depending on strength of the stress, components of the semiconductor chip CP may be damaged by the stress. For example, cracks may occur in a part of the insulating film PV due to the shear stress.

In addition, when the shear stress occurs along an extending direction of the conductor pattern CBP in the uppermost layer disposed in the lower layer of the pad PD, a phenomenon may occur in which a position of the conductor pattern CBP moves (slides) due to the stress.

A magnitude of the shear stress increases in proportion to a volume of the metal member, in addition to a value of the linear expansion coefficient of the metallic material. Therefore, reducing a thickness of the pad PD (a length from one to the other of the bonding surface PDt and a back surface PDb on a side opposite to the bonding surface PDt) allows the shear stress value to be reduced. In the case of the present embodiment, a thickness THpd of the pad PD is not more than a thickness THpv of the insulating film PV on the pad PD. For example, the thickness THpv of the insulating film PV illustrated in FIG. 6 is substantially 1 µm. In contrast, the thickness THpd of the pad PD is substantially 450 nm to 1 µm. In addition, in the example illustrated in FIG. 6, the thickness THpd of the pad PD is smaller than a thickness TH1 of the insulating layer IML1. Note that the thickness TH1 of the insulating layer IML1 has various modifications, and for example, there may be a case where the thickness TH1 is equal to the thickness THpd of the pad PD or is less than the thickness THpd. Thus, reducing the thickness THpd of the pad PD allows the shear stress value occurring in the extending direction of the pad PD to be reduced. Note that the thickness THpd of the pad PD illustrated in FIG. 6 is the thickness of the pad PD before the wire BW (see FIG. 2) is bonded in the wire bonding process described below.

In addition, among the conductor patterns CBP formed in the plurality of wiring layers DL, the conductor pattern CBP formed in the uppermost layer is formed thicker than the conductor pattern CBP formed in another wiring layer DL. Therefore, in order to reduce the shear stress value occurring in the extending direction of the conductor pattern CBP in the uppermost layer, it is preferable to reduce a thickness of the conductor pattern CBP in the uppermost layer (a length from one to the other of an upper surface CBt and a lower surface CBb). For example, a thickness THcb of the conductor pattern CBP in the uppermost layer illustrated in FIG. 6 is substantially 450 nm to 1 µm. Thus, reducing the thickness THcb of the conductor pattern CBP in the uppermost layer allows the shear stress value occurring in the extending direction of the conductor pattern CBP in the uppermost layer to be reduced.

<Method of Manufacturing Semiconductor Device>

Figure 7:
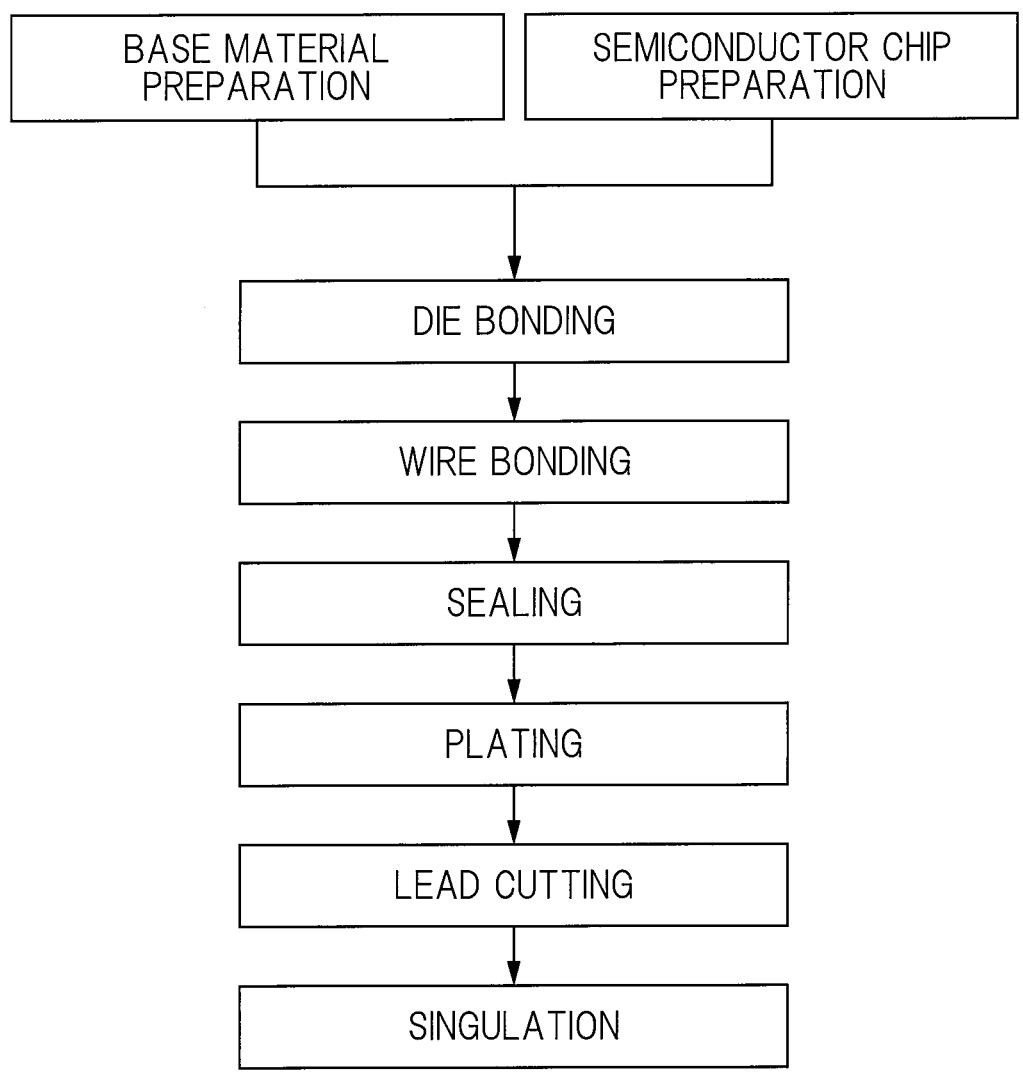
FIG. 7 is an explanatory diagram indicating an assembly flow of the semiconductor device according to the one embodiment.

Next, a method of manufacturing the semiconductor device PKG1 illustrated in FIG. 1 will be described. The semiconductor device PKG1 of the present embodiment is manufactured according to the assembly flow illustrated in FIG. 7. FIG. 7 is an explanatory diagram indicating an assembly flow of the semiconductor device according to the present embodiment.

<Base Material Preparation Process>

Figure 8:
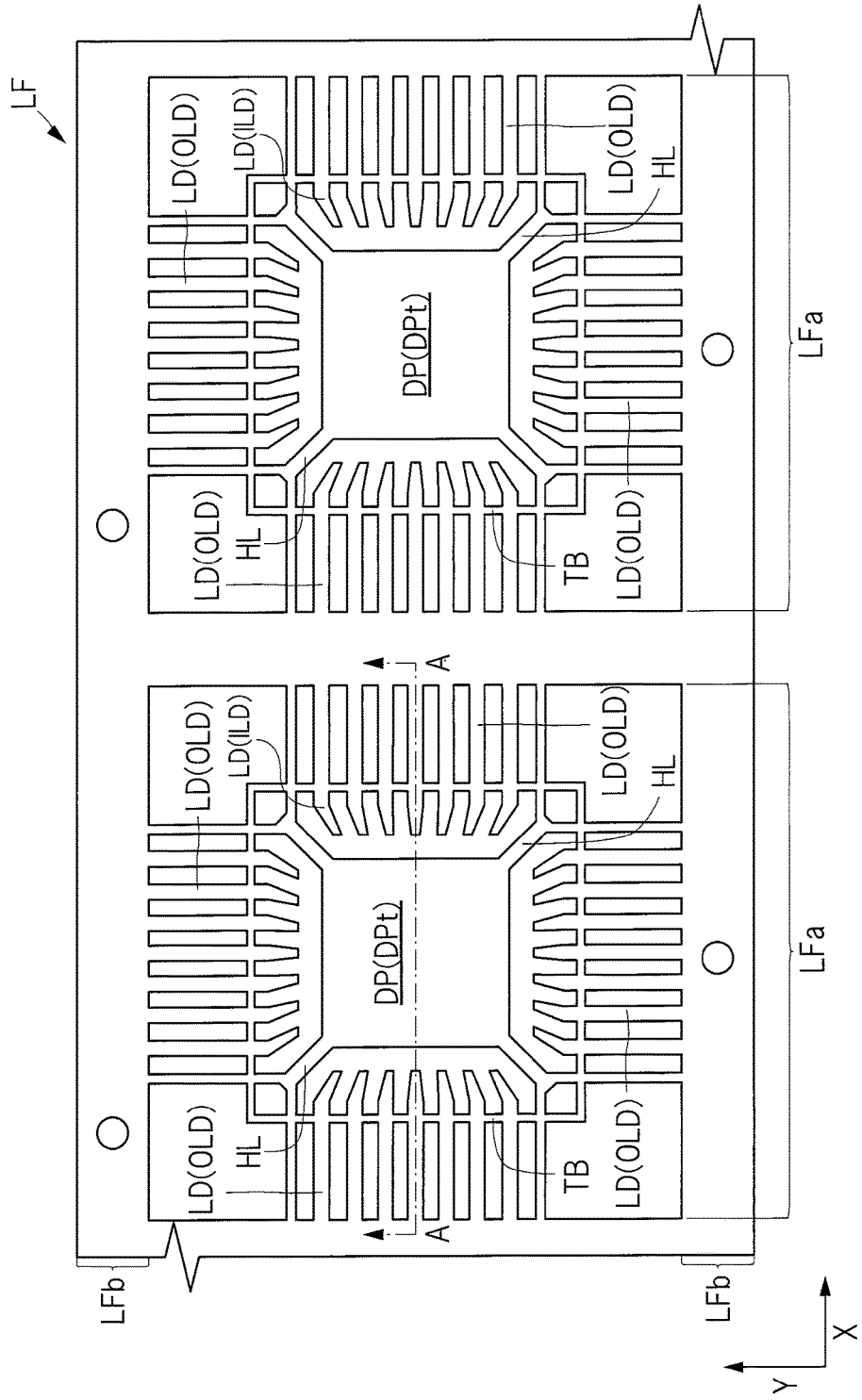
FIG. 8 is an enlarged plan view illustrating a part of a lead frame prepared in a base material preparation process illustrated in FIG. 7.

In the base material preparation process illustrated in FIG. 7, a lead frame (base material) LF illustrated in FIG. 8 is prepared. FIG. 8 is an enlarged plan view illustrating a part of a lead frame prepared in a base material preparation process illustrated in FIG. 7.

The lead frame LF prepared in this process includes a plurality of device forming portions LFa inside a frame portion LFb. The lead frame LF is made of a metal and is made of a metal containing, for example, copper (Cu) as a main component in the present embodiment.

Note that, in the present embodiment, as illustrated in FIG. 7, a plating process is performed after a sealing process, and an example in which the metal film MC illustrated in FIG. 2 is formed over the outer lead portion OLD will be described. However, as a modification, in a stage of the base material preparation process, the front surface of the base material whose main component is copper may be covered with the metal film MC in advance. In this case, the entire exposed surface of the lead frame LF is covered with the metal film MC.

In addition, as illustrated in FIG. 8, the die pad DP being the chip mounting portion is formed in a central portion of each of the device forming portion LFa. Each of the plurality of suspension leads HL is connected to the die pad DP and disposed in such a manner as to extend toward a corner portion of the device forming portion LFa. The die pad DP is supported by the frame portion LFb of the lead frame LF via the suspension lead HL.

In addition, the plurality of leads LD are formed between the respective plurality of suspension leads HL on the periphery of the die pad DP. Each of the plurality of leads LD is connected to the frame portion LFb. In the example of the present embodiment, the plurality of leads LD are provided around the die pad DP and are formed in such a manner as to extend in four directions.

In addition, the plurality of leads LD are connected with one another via a tie bar TB. The tie bar TB has not only a function as a connecting member connecting the plurality of leads LD, but also a function as a dam member preventing leakage of resin in the sealing process illustrated in FIG. 7.

<Semiconductor Chip Preparation Process>

In addition, in the semiconductor chip preparation process illustrated in FIG. 7, the semiconductor chip CP described with reference to FIGS. 4 to 6 is prepared. In this process, for example, a semiconductor wafer made of the plurality of semiconductor elements Q1 (see FIG. 6) and the wiring layer DL (see FIG. 6) to be electrically connected therewith is prepared on a main surface side (the upper surface SSt side of the semiconductor substrate SS illustrated in FIG. 6) of the semiconductor wafer (not illustrated) made of silicon. In addition, a plurality of pads PD (see FIG. 4) are formed in the uppermost layer of the wiring layer DL.

In addition, the insulating film PV (see FIG. 6) is formed in such a manner as to cover the wiring layer DL in the uppermost layer on which the plurality of pads PD are formed. Thereafter, the plurality of openings PVk (see FIG. 4) are formed in the insulating film PV such that at least a part of each of the plurality of pads PD is exposed. After the above-described semiconductor wafer is formed, the semiconductor wafer is cut along a dicing line of the semiconductor wafer, and a plurality of semiconductor chips CP illustrated in FIG. 4 are acquired.

Note that, in the present embodiment, the base material preparation process is described earlier, and the semiconductor chip preparation process is described later, but any one of the base material preparation process and the semiconductor chip preparation process may be performed earlier, or they may be performed at the same time. The die bonding process is performed after the completion of both the base material preparation process and the semiconductor chip preparation process.

<Die Bonding Process>

Figure 9:
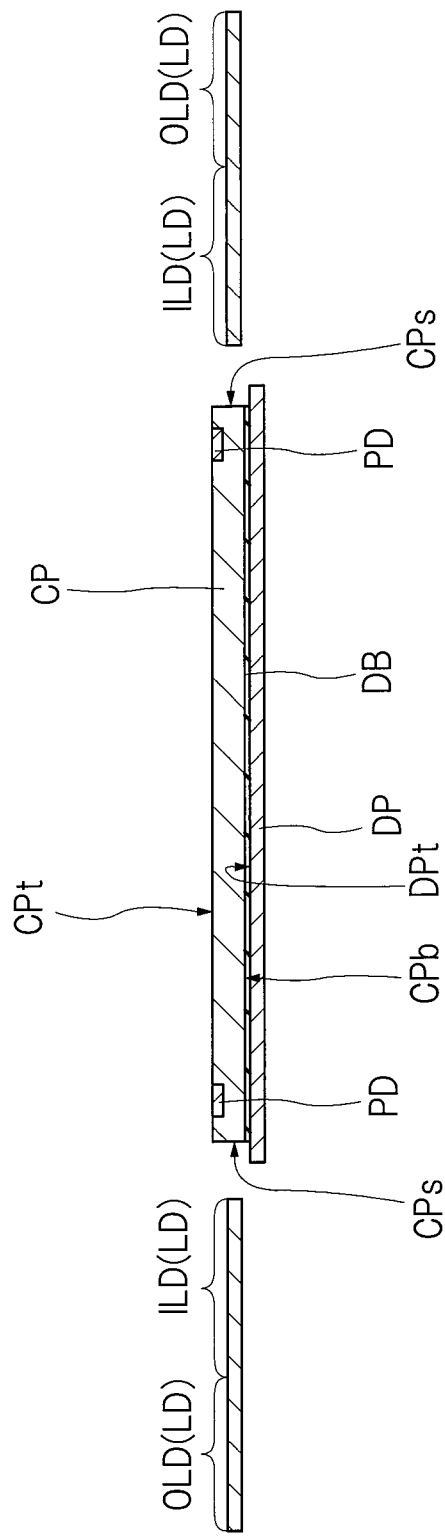
FIG. 9 is an enlarged cross-sectional view illustrating a state in which the semiconductor chip is mounted on a die pad of the lead frame in a cross section taken along a line A-A in FIG. 8.

Next, in the die bonding process (semiconductor chip mounting process) illustrated in FIG. 7, the semiconductor chip CP is mounted over the die pad DP as illustrated in FIG. 9. FIG. 9 is an enlarged cross-sectional view illustrating a state in which the semiconductor chip is mounted over the die pad of the lead frame in a cross section taken along a line A-A in FIG. 8.

As illustrated in FIG. 9, the semiconductor chip CP has the front surface CPt in which the plurality of pads PD are formed and the back surface CPb positioned on the side opposite to the front surface CPt. In this process, the semiconductor chip CP and the die pad DP are bonded and fixed via the die bonding material DB. In the example illustrated in FIG. 9, the semiconductor chip CP is mounted in such a manner that a part of the upper surface DPt of the die pad DP is covered with the semiconductor chip CP in a plan view. The die bonding material DB is an adhesive material bonding and fixing the semiconductor chip CP and the die pad DP and has, for example, a paste-like property before curing. When the semiconductor chip CP is mounted by using a paste-like adhesive material, a paste-like adhesive material is disposed in advance on the upper surface DPt being the chip mounting surface of the die pad DP before the semiconductor chip CP is mounted. Thereafter, pressing the semiconductor chip CP against the die pad DP spreads out the paste-like adhesive material. Thereafter, for example, the adhesive material is cured by heating, and the semiconductor chip CP is fixed. However, the die bonding material DB is not limited to the above, and for example, a resin film referred to as a die attach film (DAF) or the like can be used. In this case, for example, a die bonding material DB being a tape material (film material) having adhesive layers on both sides is attached to the back surface CPb of the semiconductor chip CP in advance, and the semiconductor chip CP is bonded via the tape material. Thereafter, for example, a thermosetting resin component contained in the die bonding material DB is thermally cured to fix the semiconductor chip CP.

In addition, in the example of the present embodiment, the semiconductor chip CP is mounted over the die pad DP by the so-called face-up mounting method in such a manner that the back surface CPb faces the upper surface DPt being the chip mounting surface of the die pad DP.

<Wire Bonding Process>

Figure 10:
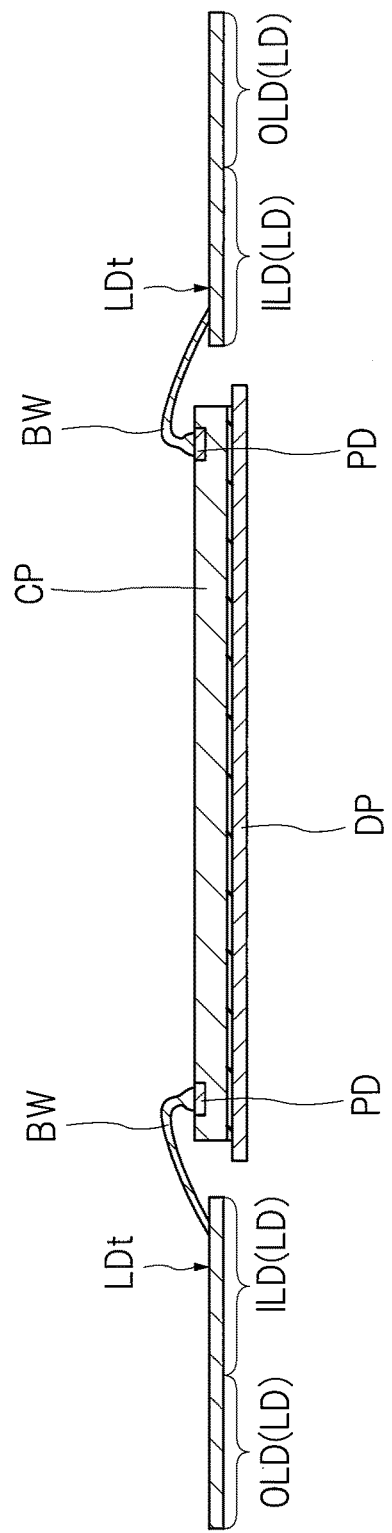
FIG. 10 is an enlarged cross-sectional view illustrating a state in which the semiconductor chip illustrated in FIG. 9 and a plurality of leads are electrically connected via wires.

Next, in the wire bonding process illustrated in FIG. 7, as illustrated in FIG. 10, the plurality of pads PD formed in the front surface CPt of the semiconductor chip CP and the plurality of leads LD disposed on the periphery of the semiconductor chip CP are electrically connected with each other via the plurality of wires (conductive members) BW. FIG. 10 is an enlarged cross-sectional view illustrating a state in which the semiconductor chip illustrated in FIG. 9 and the plurality of leads are electrically connected via wires.

Although details of this process will be described below, in this process, the one end (ball portion) of the wire BW made of a metallic material such as copper (Cu), for example, is bonded to the pad PD of the semiconductor chip CP, and the other end (stitch portion) is bonded to the inner lead portion ILD of the lead LD. Thus, the pad PD of the semiconductor chip CP and the lead LD are electrically connected to each other via the wire BW. In the present embodiment, the wire BW is connected by a so-called positive bonding method in which the pad PD of the semiconductor chip CP is the first bond and the upper surface LDt of the lead LD of the lead frame LF is the second bond side. The wire bonding process will be described in detail below.

<Sealing Process>

Figure 11:
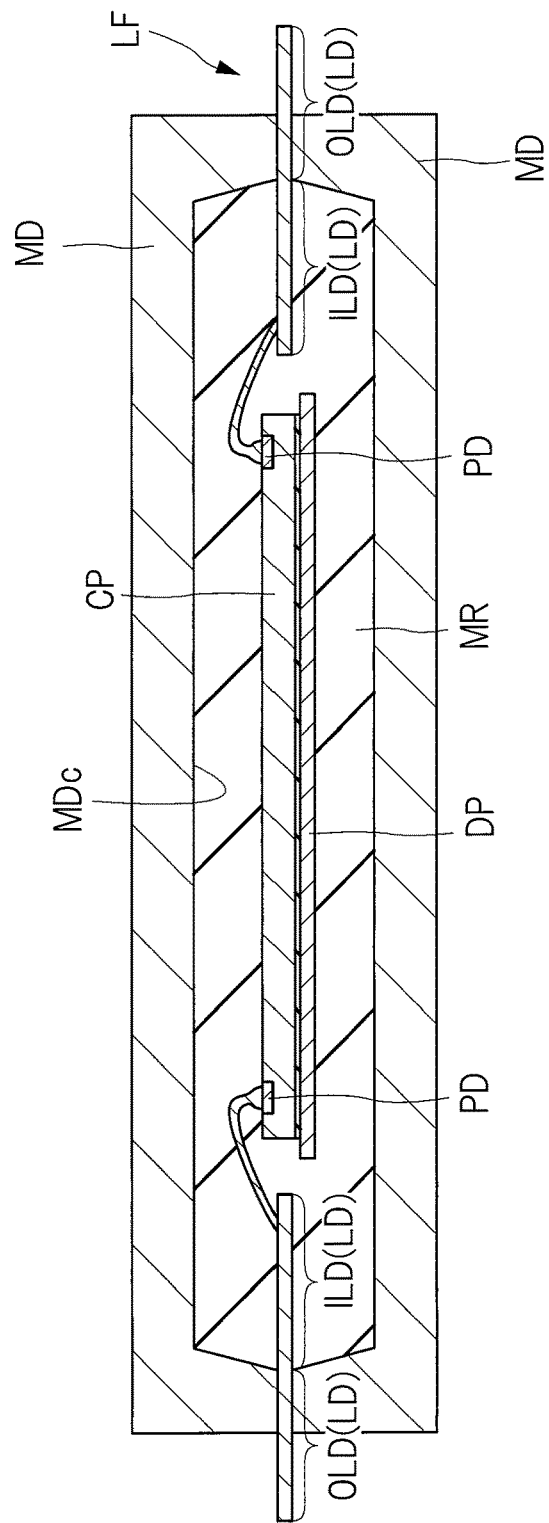
FIG. 11 is an enlarged cross-sectional view illustrating a state in which the semiconductor chip illustrated in FIG. 10 is sealed with a resin.

Next, in the sealing process illustrated in FIG. 7, the semiconductor chip CP, the plurality of wires BW, and the respective inner lead portions ILD of the plurality of leads LD illustrated in FIG. 10 are sealed with a resin, and the sealing body MR illustrated in FIG. 11 is formed. FIG. 11 is an enlarged cross-sectional view illustrating a state in which the semiconductor chip illustrated in FIG. 10 is sealed with a resin.

In this process, as illustrated in FIG. 11, the resin is supplied into a space formed by a cavity MDc with the lead frame LF disposed in a molding die MD having a cavity MDc, and then, the resin is cured, whereby the sealing body (resin body) MR is formed. A method of forming such a sealing body MR is referred to as a transfer molding method.

The cavity MDc of the molding die MD is disposed in a region surrounded by the tie bar TB (see FIG. 8) in each of the plurality of device forming portions LFa (see FIG. 8) in a plan view. Therefore, a body portion of the sealing body MR is formed in the region surrounded by the tie bar TB of each of the device forming portions LFa. In addition, a part of the resin leaking from the cavity MDc is dammed by the tie bar TB. Therefore, of each of the plurality of leads LD, the outer lead portion OLD positioned outside the tie bar TB is not sealed with resin and is exposed from the sealing body MR. In this process, the entire semiconductor chip CP, the entire die pad DP, the whole of the plurality of wires BW, and a part of each of the plurality of leads LD (inner lead portion ILD) are sealed.

<Plating Process>

Next, in the plating process illustrated in FIG. 7, a metal film MC (see FIG. 2) is formed over a part (outer lead portion OLD, exposed surface) of each of the plurality of leads LD exposed from the sealing body MR illustrated in FIG. 11 by plating. In this process, a metal film MC made of, for example, solder is formed over the exposed surface of the lead LD. In addition, as a method of forming the metal film MC, an electroplating method in which ionized metal ions are deposited over the exposed surface of the lead LD can be applied. In the case of the electroplating method, it is preferable in that a film quality of the metal film MC can be easily controlled by controlling current at the time of forming the metal film MC. In addition, the electroplating method is preferable in that formation time of the metal film MC can be shortened.

<Lead Cutting Process>

Figure 12:
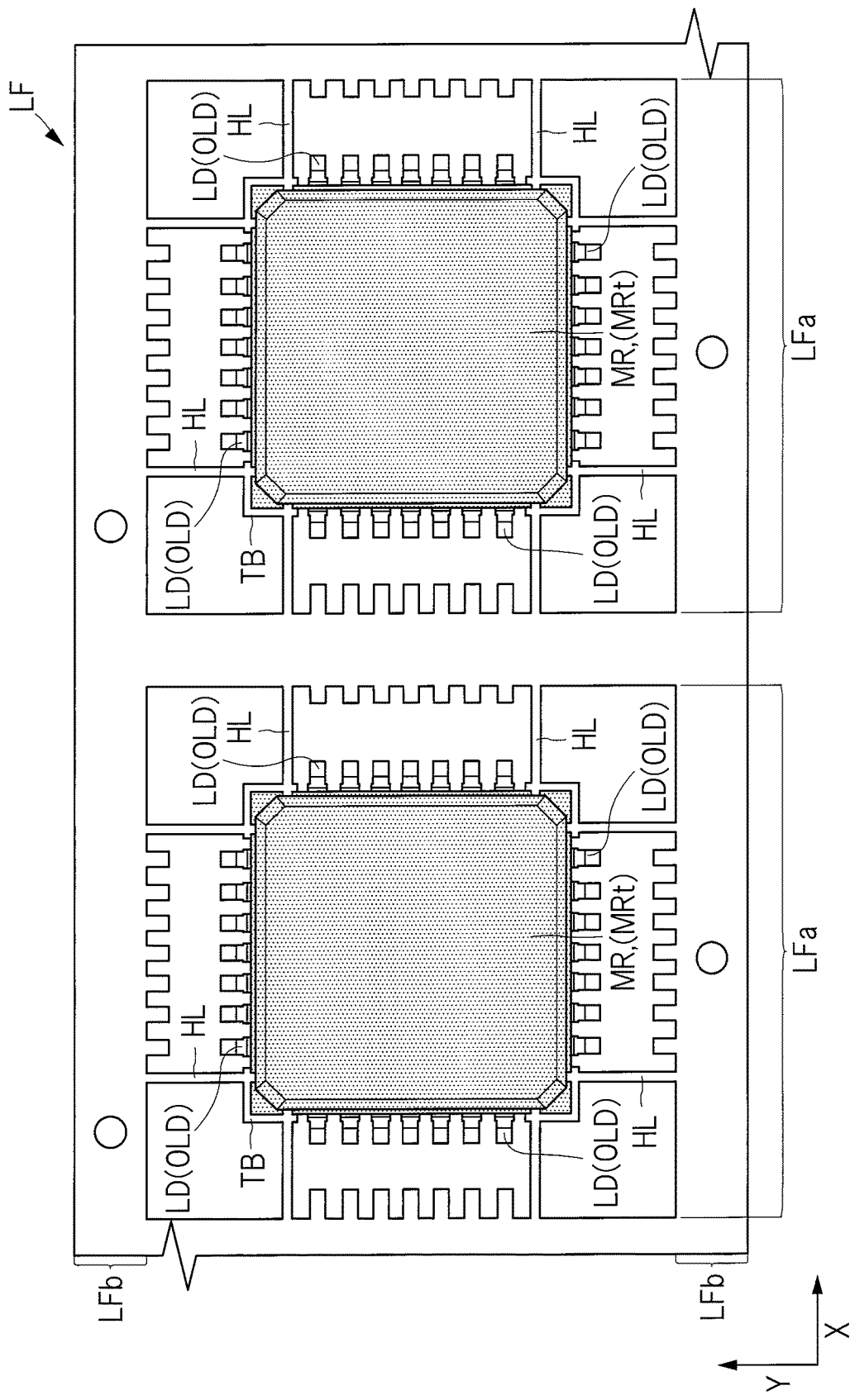
FIG. 12 is an enlarged plan view illustrating a state in which a metal film is formed on the exposed surface of the plurality of leads illustrated in FIG. 11 and each of the leads is then cut to be molded.

Next, in the lead cutting process illustrated in FIG. 7, as illustrated in FIG. 12, the outer lead portion OLD of each of the plurality of leads LD is cut, and each of the plurality of leads LD is cut off from the lead frame LF. In addition, in the present embodiment, after the lead LD is cut, a plurality of leads LD are molded, and a bending process illustrated in FIG. 2 is performed. FIG. 12 is an enlarged plan view illustrating a state in which the metal film is formed over the exposed surface of each of the plurality of leads illustrated in FIG. 11 and each of the leads is then cut to be molded.

In this process, the tie bar TB connecting the plurality of leads LD is cut. In addition, each of the plurality of leads LD is cut off from the frame portion LFb. As a result, the plurality of leads LD are independent members separated from one another. In addition, after the plurality of leads LD are cut off, the sealing body MR and the plurality of leads LD are supported by the frame portion LFb via the suspension lead HL.

Note that, although a procedure of cutting the tie bar TB after the plating process has been described in the present embodiment, a procedure of cutting only the tie bar TB first, then performing the plating process, and further cutting off each of the plurality of leads LD from the frame portion LFb may be applicable. Thus, the metal film MC can be formed also on the cut surface of the tie bar TB, thereby preventing discoloration of the cut surface of the tie bar TB due to oxidation. In addition, since the plating process is performed before the lead LD is cut off from the frame portion LFb, deformation of the lead LD by a plating solution can also be prevented.

The plurality of leads LD and the tie bar TB are cut by press working with use of, for example, a cutting die (not illustrated). In addition, for example, performing a bending processing on the outer lead portion OLD of each of the plurality of leads LD by press working with use of a molding die (not illustrated) allows the plurality of leads LD after cutting to be molded, for example, as illustrated in FIG. 2.

<Singulation Process>

Next, in the singulation process illustrated in FIG. 7, each of the plurality of suspension leads HL illustrated in FIG. 12 is cut, and the semiconductor package is separated in each of the plurality of device forming portions LFa. In this process, the plurality of suspension leads HL and the resin left at the corners of the sealing body MR are cut, and the semiconductor device PKG1 (more specifically, an inspection target before the inspection process) illustrated in FIG. 1 being a semiconductor package is acquired. For example, as the cutting method, similarly to the lead molding process, cutting by press working with use of a cutting die (not illustrated) can be performed.

After this process, required inspections and tests such as a visual inspection and an electrical test are performed, and those passing these inspections and tests are the finished semiconductor devices PKG1 illustrated in FIGS. 1 to 3. Then, the semiconductor device PKG1 is shipped, or mounted on a mounting board (not illustrated).

<Details of Wire Bonding Process>

Figure 13:
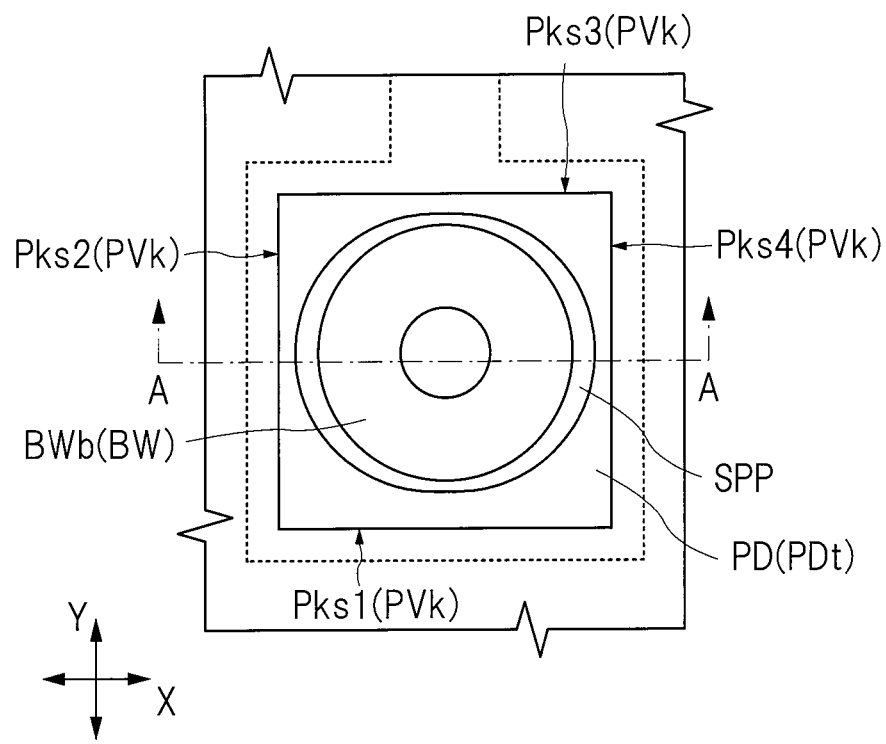
FIG. 13 is an enlarged plan view illustrating a state in which a wire is connected to a pad in a portion B in FIG. 4.
Figure 14:
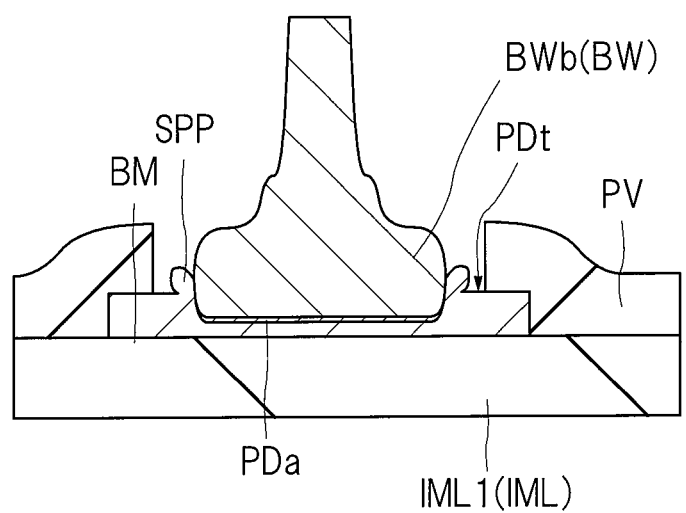
FIG. 14 is an enlarged cross-sectional view taken along a line A-A of FIG. 13.

Next, details of the wire bonding process illustrated in FIG. 7 will be described. FIG. 13 is an enlarged plan view illustrating a state in which the wire is connected to the pad in a portion B in FIG. 4. FIG. 14 is an enlarged cross-sectional view taken along a line A-A of FIG. 13.

As illustrated in FIG. 10, in the wire bonding process of the present embodiment, one end of the wire BW is bonded to the pad PD of the semiconductor chip CP, and the other end of the wire BW is bonded to the inner lead portion ILD of the lead LD. In addition, in the process of bonding the wire BW and the pad PD, the wire BW is bonded to the pad PD by the so-called ball bonding method in which the ball portion formed on the wire BW is pressure-bonded to the pad PD.

Although details will be described below, as illustrated in FIGS. 13 and 14, when the ball portion BWb of the wire BW is bonded to the pad PD by the ball bonding method, applying high frequency vibration such as ultrasonic vibration to the ball portion BWb can improve the bonding strength. "Ultrasonic wave" and "ultrasonic vibration" are elastic waves having frequencies higher than the human audible range. In the present application, the high frequency of 20 kHz or more is referred to as "ultrasonic wave" or "ultrasonic vibration." Meanwhile, mere "vibration" includes elastic waves of wavelengths less than 20 kHz in addition to ultrasonic waves. When ultrasonic vibration is applied, for example, as illustrated in FIG. 14, an alloy layer PDa (see FIG. 14) of a metal constituting the wire BW and a metal constituting the pad PD is formed on a bonding interface between the ball portion BWb and the pad PD. In addition, if an oxide film of the pad PD is interposed between the bonding surface PDt and the ball portion BWb, this will cause reduction in bonding strength or reduction in electrical characteristics, so that it is preferable to perform an operation for removing the oxide film formed on the exposed surface of the bonding surface PDt (scrubbing operation described below).

However, according to the study of the inventor of the present application, when high frequency vibration such as ultrasonic vibration is applied to the ball portion BWb while performing the scrubbing operation, an alloy layer is formed on a part of the interface between the bonding surface PDt and the ball portion BWb, and in another part, the alloy layer is not formed due to inhibition by the oxide film before removal. Thus, it was found that stress is easily concentrated locally when the bonding interface becomes nonuniform. In particular, as in the present embodiment, it was found that the pad PD itself may be damaged by the above stress when the thickness THpd of the pad PD (see FIG. 6) is small.

In addition, damage to the pad PD itself or damage to the member in the lower layer of the pad PD may be caused by a large load applied to the pad PD in the wire bonding process. However, according to the study of the inventor of the present application, it was found that the damage to the pad PD itself or the damage to the member in the lower layer of the pad PD is mainly caused by the stress occurring when the bonding interface becomes nonuniform as described above. In other words, it was found that, if bonding can be started with the contact interface between the bonding surface PDt of the pad PD and the ball portion BWb uniformly activated, a favorable alloy layer PDa (see FIG. 14) is formed on the contact interface, and therefore, the damage to the pad PD itself or the damage to the member in the lower layer of the pad PD can be prevented.

In particular, as illustrated in FIG. 6, when the thickness THpd of the pad PD is small, damage such as cracks easily occurs in the pad PD due to the above stress. Alternatively, even if damage does not occur in the pad PD, damage such as cracks may occur in the insulating layer IML1 in close contact with the back surface PDb of the pad PD. In addition, when a crack occurs in the pad PD, the crack may develop toward the upper surface SSt of the semiconductor substrate SS.

For example, when a crack occurs in the pad PD itself or in the insulating layer IML1 interposed between the pad PD and the conductor pattern CBP and the crack then develops to be connected to another signal wiring or the like, the crack causes a leakage path of the current, so that this may cause deterioration of electrical characteristics of the semiconductor chip CP. In addition, when a wiring to be connected to an electrode different from the pad PD is formed at a position overlapping with the pad PD, if the pad PD or the like is damaged, current leakage easily occurs.

In particular, as in the present embodiment, when the ball portion BWb of the wire BW made of copper (Cu) is bonded to the pad PD made of aluminum (Al), hardness of the wire BW is greater than hardness of the pad PD. For example, when compared using Vickers hardness, the hardness of copper is 46 Hv, whereas the hardness of aluminum is 25 Hv. Thus, when a hard member is bonded to a relatively soft member, if a thickness of a portion to be bonded of the soft member is small, damage is likely to occur on the periphery of the portion to be bonded.

Meanwhile, in order to prevent damage to the periphery of the portion to be bonded, for example, when the above-described scrubbing operation is not performed, the removal of the oxide film at the bonding interface becomes insufficient, so that this causes reduction in bonding strength or deterioration of electrical characteristics. In addition, for example, when a load to be applied together with ultrasonic vibration is set to a low load in order to prevent damage to the periphery of the portion to be bonded, lack of load causes reduction in bonding strength. In particular, when the ball portion BWb of the wire BW made of copper (Cu) is bonded to the pad PD made of aluminum (Al) as in the present embodiment, after the entire interface between the bonding surface PDt and the ball portion BWb reaches a uniform state (activated state suitable for forming an alloy layer), ultrasonic waves are applied while a sufficiently high load (for example, substantially 0.15 N (newtons)) is applied. As a result, a favorable bonding state can be easily obtained. Note that, although details will be described below, in the present embodiment, the process for making the entire interface between the bonding surface PDt and the ball portion BWb uniform includes a step of performing a scrubbing operation (a scrubbing step ST4 illustrated in FIG. 17 described below) and a step of applying ultrasonic waves with a load to such an extent that the alloy layer is not formed applied (activation step ST5 illustrated in FIG. 17).

When the thickness THpd (see FIG. 6) of the pad PD is small as in the present embodiment, particularly when ball bonding is performed, a technique for reducing the load (stress) applied to the portion to be bonded and for improving the bonding strength is required. In the following, the wire bonding process of the present embodiment will be described in order with reference to the accompanying drawings.

Figure 15:
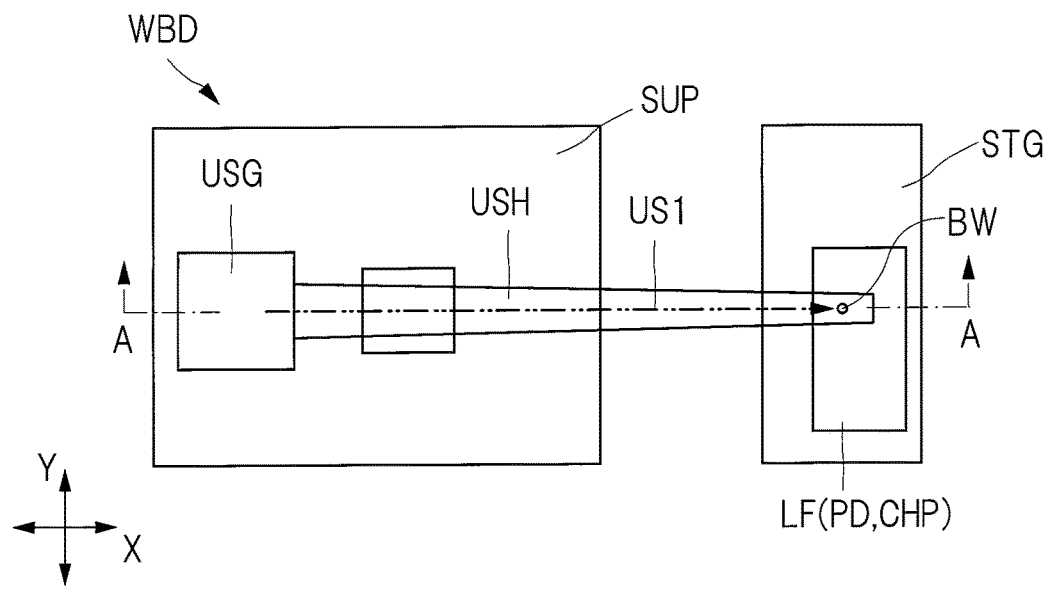
FIG. 15 is a plan view illustrating a positional relation between the wire bonding device used in the wire bonding process illustrated in FIG. 7 and the lead frame.
Figure 16:
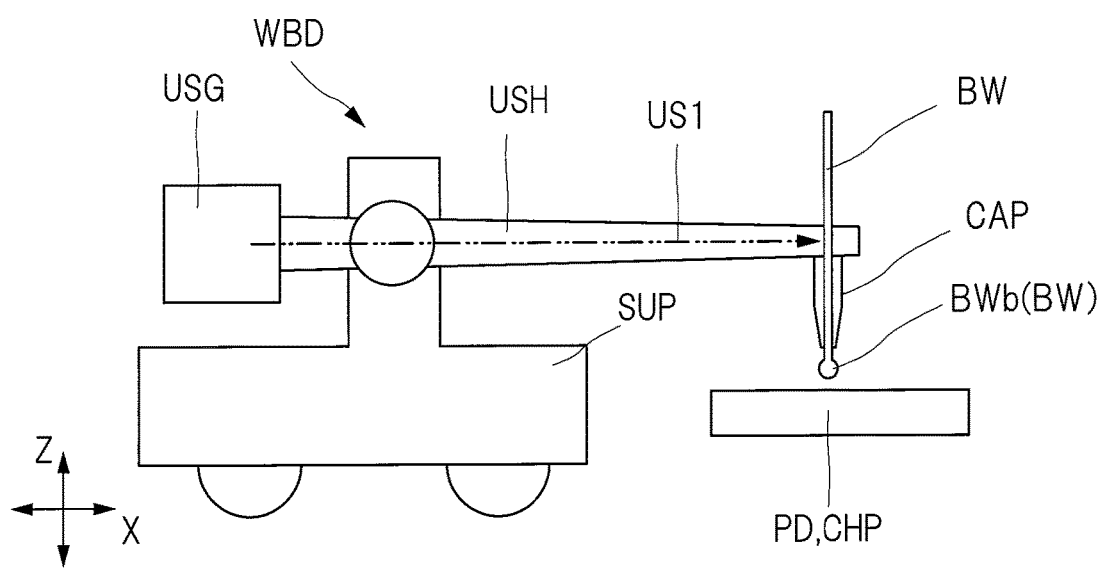
FIG. 16 is a cross-sectional view schematically illustrating a cross section taken along a line A-A in FIG. 15.
Figure 17:
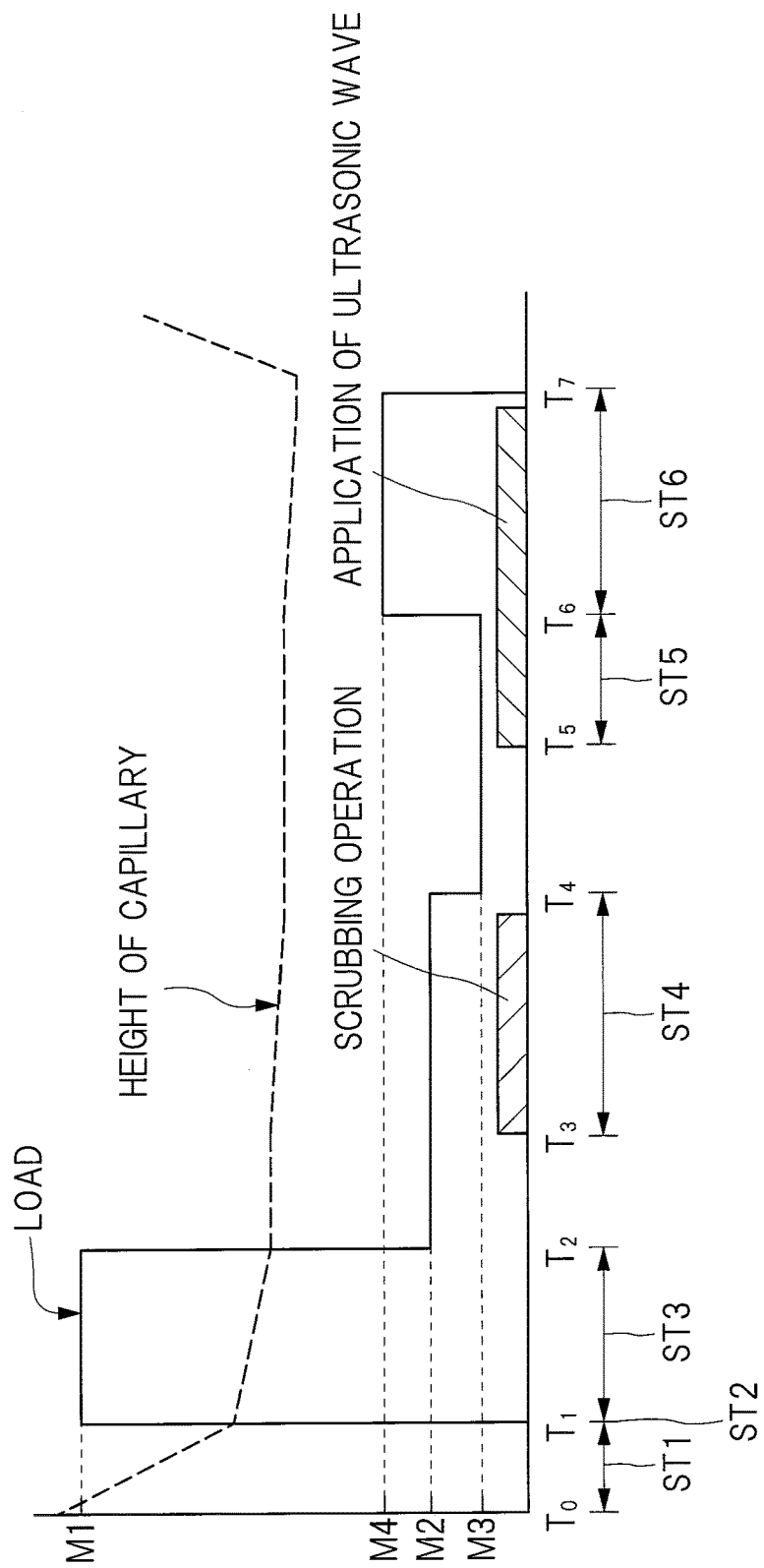
FIG. 17 is a timing chart illustrating a relation among a height of a bonding tool, a load applied to a ball portion, presence or absence of scrubbing operation, and presence or absence of ultrasonic vibration in the process of connecting the ball portion of the wire and the pad in the wire bonding process illustrated in FIG. 7.

FIG. 15 is a plan view illustrating a positional relation between the wire bonding device used in the wire bonding process illustrated in FIG. 7 and the lead frame. FIG. 16 is a cross-sectional view schematically illustrating a cross section taken along a line A-A in FIG. 15. Also, FIG. 17 is a timing chart illustrating a relation among a height of a bonding tool, a load applied to the ball portion, presence or absence of scrubbing operation, and presence or absence of ultrasonic vibration in the process of connecting the ball portion of the wire and the pad in the wire bonding process illustrated in FIG. 7. In FIG. 17, each of a period during which a scrubbing operation described below is performed and a period during which ultrasonic waves are applied is hatched to be illustrated. In addition, each of FIGS. 18 to 25 is an enlarged plan view or an enlarged cross-sectional view illustrating the operation of each step performed at each time illustrated in the timing chart in FIG. 17. Note that, in FIGS. 14 and 25 described above, the alloy layer PDa is clearly illustrated between the ball portion BWb and the pad PD, but there are various modifications in thickness and shape of the alloy layer PDa.

In the wire bonding process of the present embodiment, for example, as illustrated in FIG. 15, a wire bonding device WBD is disposed next to a stage STG to which the lead frame LF is fixed. The lead frame LF and the wire bonding device WBD are disposed, for example, in the positional relation illustrated in FIG. 15. That is, the wire bonding device WBD is disposed in such a manner that the horn USH extends along the X direction in a plan view, and the lead frame LF is disposed on an opposite side of the oscillator USG with the horn USH interposed therebetween. Thus, an ultrasonic wave US1 oscillating along the X direction can be applied to the ball portion BWb of the wire BW (see FIG. 16).

In addition, the wire bonding device WBD includes a support portion SUP supporting a bonding head portion including a capillary CAP, a horn USH, and an oscillator USG illustrated in FIG. 16. The support portion SUP can be freely moved along an X-Y plane illustrated in FIG. 15, and moving a position of the bonding head together with the support portion SUP allows the wire BW to be connected to each of the plurality of pads PD of the lead frame LF.

In addition, in the ball bonding process, a tip portion of the horn USH to which the capillary CAP is fixed is pushed downward, so that the load to be applied to the ball portion BWb of the wire BW is transmitted to the ball portion BWb via the capillary CAP.

As illustrated in FIG. 16, the wire bonding process of the present embodiment includes a step of forming the ball portion BWb (ball portion forming step ST1 illustrated in FIG. 17) at the end of the wire BW protruding from the lower end side of the capillary CAP. The ball portion BWb is formed by discharging from an electric torch (not illustrated) at a tip of the wire BW. The ball portion forming step ST1 is performed at the time (timing) To illustrated in FIG. 17.

Figure 18:
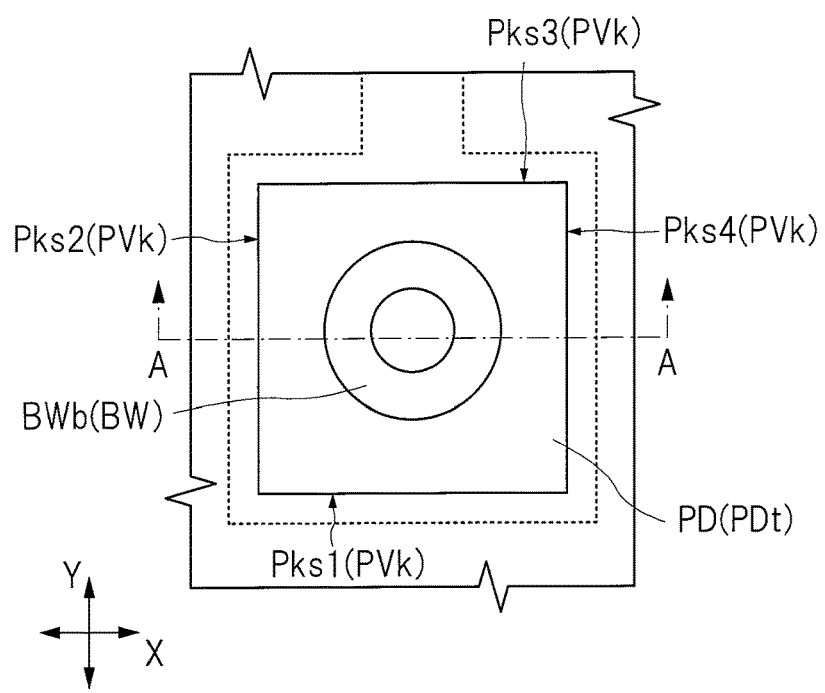
FIG. 18 is an enlarged plan view illustrating a state in which the ball portion is in contact with the pad corresponding to the pad in FIG. 13.
Figure 19:
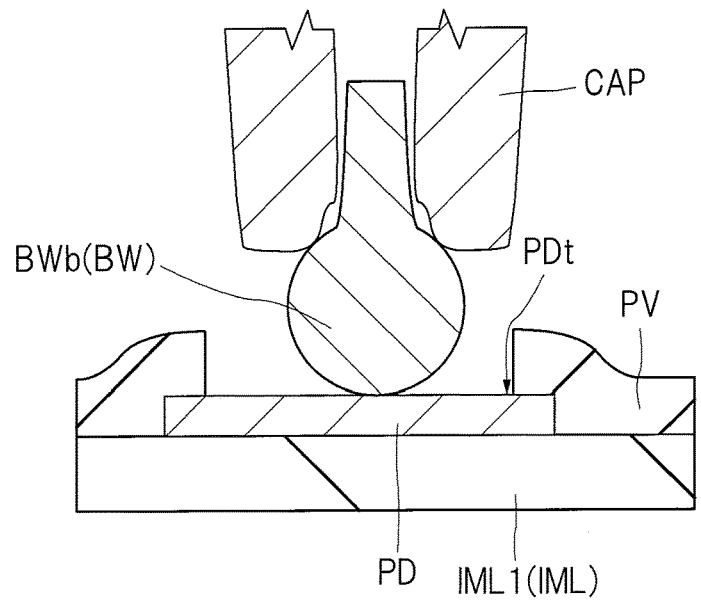
FIG. 19 is an enlarged cross-sectional view taken along a line A-A of FIG. 18.

In addition, as illustrated in FIGS. 18 and 19, the wire bonding process includes a step of bringing the ball portion BWb of the wire BW into contact with the bonding surface PDt of the pad PD (ball portion contact step ST2 illustrated in FIG. 17). The ball portion contact step ST2 is performed at the time (timing) $T_1$ illustrated in FIG. 17. In this step, a tip portion of the spherical ball portion BWb held at a tip of the capillary CAP being a bonding tool comes into contact with the bonding surface PDt.

Figure 20:
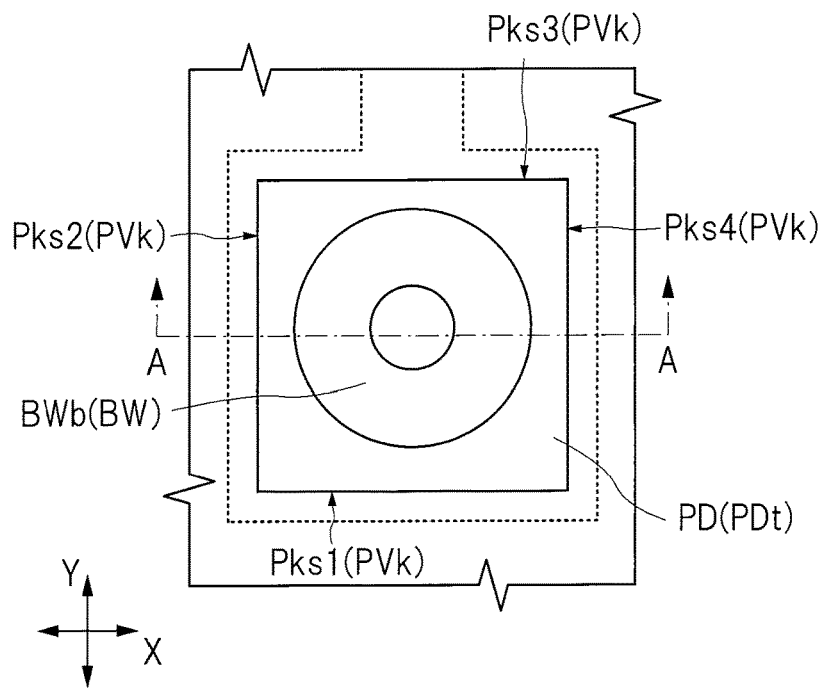
FIG. 20 is an enlarged plan view illustrating a state in which the ball portion illustrated in FIG. 18 is pressed to be deformed.
Figure 21:
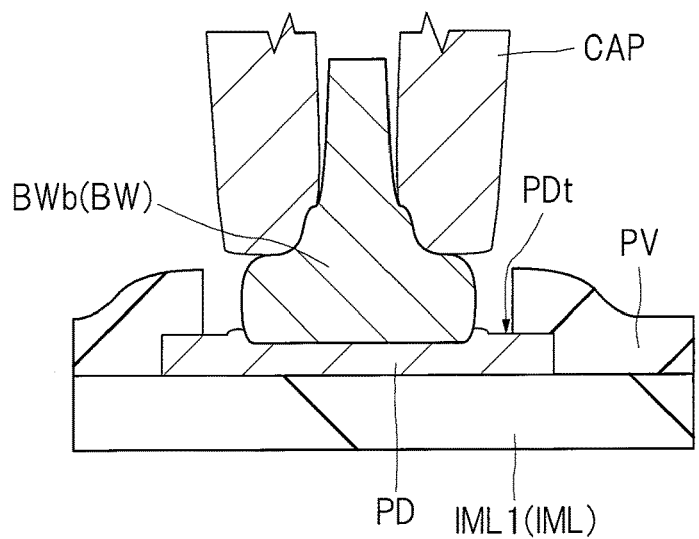
FIG. 21 is an enlarged cross-sectional view taken along a line A-A of FIG. 20.

In addition, as illustrated in FIGS. 20 and 21, after the ball portion contact step ST2, the wire bonding process includes a step of pressing the ball portion BWb of the wire BW toward the bonding surface PDt with a load M1 (see FIG. 17) to deform the ball portion BWb (ball portion deformation step ST3 illustrated in FIG. 17). The ball portion deformation step ST3 is performed between the time $T_1$ and the time (timing) $T_2$ illustrated in FIG. 17. In the ball portion deformation step ST3, a load is applied to the ball portion BWb via the capillary CAP, and the ball portion BWb is pressed in the thickness direction of the pad PD. A magnitude of the load M1 applied at this time is the largest between the time $T_1$ and the time (timing) $T_7$ illustrated in FIG. 17, for example, substantially 0.8 N (newtons). At this time, the ball portion BWb and the pad PD are heated. In addition, the ball portion BWb is sandwiched between the pad PD and the capillary CAP and is deformed following a shape of the capillary CAP. In addition, as illustrated in FIG. 21, a part of the ball portion BWb is pressed against the pad PD, and a part of the pad PD is deformed. At this time, since the part of the ball portion BWb is embedded into the pad PD, a part of the metallic material constituting the pad PD in the embedded region is discharged to the periphery of the ball portion BWb. For this reason, as illustrated in FIG. 21, the bonding surface PDt of the pad PD comes into a state where a height of the periphery of the region in close contact with the ball portion BWb is raised higher than a height of the region in close contact with the ball portion BWb.

In addition, in the present embodiment, the period during which the ball portion deformation step ST3 applying a high load is performed is shorter than a period during which the scrubbing step ST4 illustrated in FIG. 17 is performed or ultrasonic waves are applied. A length of the period during which the ball portion deformation step ST3 is performed (time $T_2$–time $T_1$) is substantially 1 msec (millisecond). Thus, of the ball portion BWb illustrated in FIG. 21, applying a high load for a short period of time allows flatness of the surface in close contact with the bonding surface PDt to be improved.

As illustrated in FIG. 17, ultrasonic waves are not applied and the scrubbing operation described below is not performed between time $T_1$ and time $T_2$, in other words, during the ball portion deformation step ST3. Therefore, in the ball portion deformation step ST3, even when a relatively large load is applied, damage to the pad PD itself or the insulating layer IML1 hardly occurs.

Figure 22:
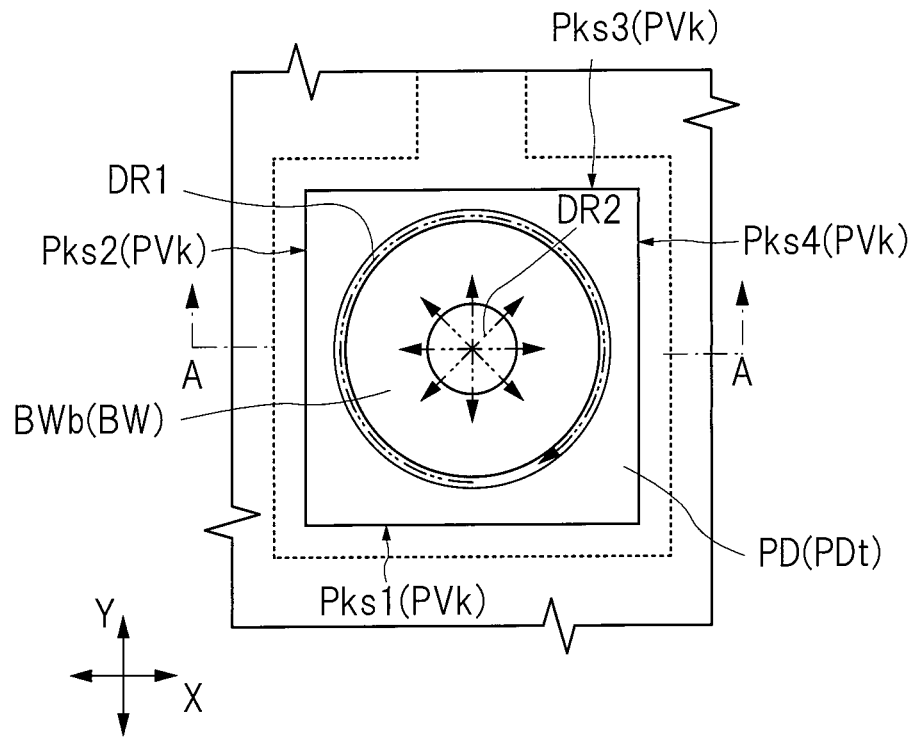
FIG. 22 is an enlarged plan view schematically illustrating a direction in which the ball portion illustrated in FIG. 20 is scrubbed.
Figure 23:
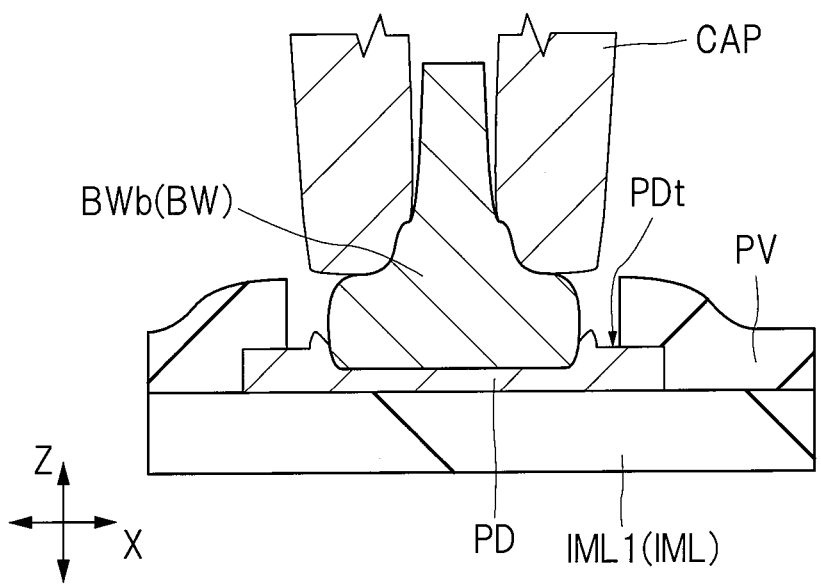
FIG. 23 is an enlarged cross-sectional view taken along a line A-A of FIG. 22.

In addition, as illustrated in FIGS. 22 and 23, after the ball portion deformation step ST3 (see FIG. 17), the wire bonding process includes a step (scrubbing step ST4 illustrated in FIG. 17) of moving the ball portion BWb in a plurality of directions including the X direction and the Y direction in a plan view while pressing the ball portion BWb of the wire BW against the pad PD with a load M2 (see FIG. 17) smaller than the load M1 (see FIG. 17).

The support portion SUP of the wire bonding device WBD illustrated in FIGS. 15 and 16 can be freely moved in the X-Y plane illustrated in FIG. 15. In addition, by adjusting a movement amount of the support portion SUP, an operation of moving the relative positional relation between the ball portion BWb and the pad PD in a plan view while pressing the ball portion BWb illustrated in FIG. 25 (referred to as a scrubbing operation) can be performed. When vibration is applied to the ball portion BWb with this scrubbing operation, the ball portion BWb can be mechanically vibrated with a relatively low frequency (for example, substantially 1 Hz).

Thus, vibrating the ball portion BWb at a low frequency while pressing the ball portion BWb removes the metal oxide film at the interface between the ball portion BWb and the bonding surface PDt of the pad PD. In order to stably form the alloy layer PDa (see FIG. 14) on the bonding interface between the ball portion BWb and the pad PD, the metal oxide film is preferably removed. Therefore, in the scrubbing step ST4, it is preferable to remove the metal oxide film including the peripheral region of the portion where the ball portion BWb and the pad PD are in contact.

In the case of the present embodiment, as described above, the support portion SUP of the wire bonding device WBD illustrated in FIGS. 15 and 16 can be freely moved in the X-Y plane illustrated in FIG. 15. Therefore, in the scrubbing step ST4 (see FIG. 17), the metal oxide film can be removed including the peripheral region of the portion (contact interface) where the ball portion BWb and the pad PD are in contact. Specifically, when the support portion SUP of the wire bonding device WBD simultaneously vibrates in the X direction and the Y direction in the X-Y plane illustrated in FIG. 15, adjusting a period and an amplitude of vibration in the X direction and a period and an amplitude of vibration in the Y direction allows the ball portion BWb to be operated in any direction in the X-Y plane. For example, as schematically illustrated as a direction DR1 in FIG. 22, the ball portion BWb can be operated in such a manner as to draw a circle centered on the center of the pad PD. In other words, the support portion SUP simultaneously operates in a plurality of directions in a plan view, thereby allowing the ball portion BWb to perform a circular motion (or spiral motion). In addition, for example, as illustrated as a direction DR2 in FIG. 22, the ball portion BWb can be vibrated in any directions crossing each other (for example, the X direction and the Y direction) in the X-Y plane. Thus, moving the ball portion BWb in a plurality of directions in the plane along the bonding surface PDt of the pad PD allows the metal oxide film to be reliably removed in the portion where the ball portion BWb and the pad PD are in contact and the peripheral region thereof. As a result, in the main bonding step ST6 described below, when an alloy layer PDa (see FIG. 14) of a metal of the wire BW (for example, copper) and a metal of the pad PD (for example, aluminum) is formed, the component of the metal oxide is hardly mixed in.

Figure 24:
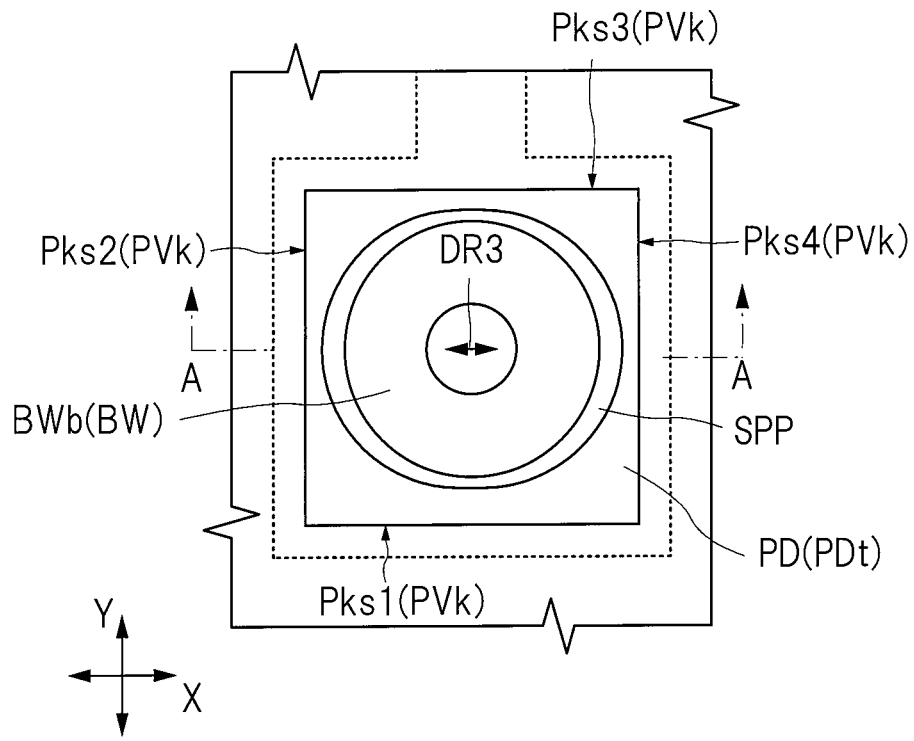
FIG. 24 is an enlarged plan view schematically illustrating a state in which an ultrasonic wave is applied to the ball portion illustrated in FIG. 22 to bond the ball portion to the pad.
Figure 25:
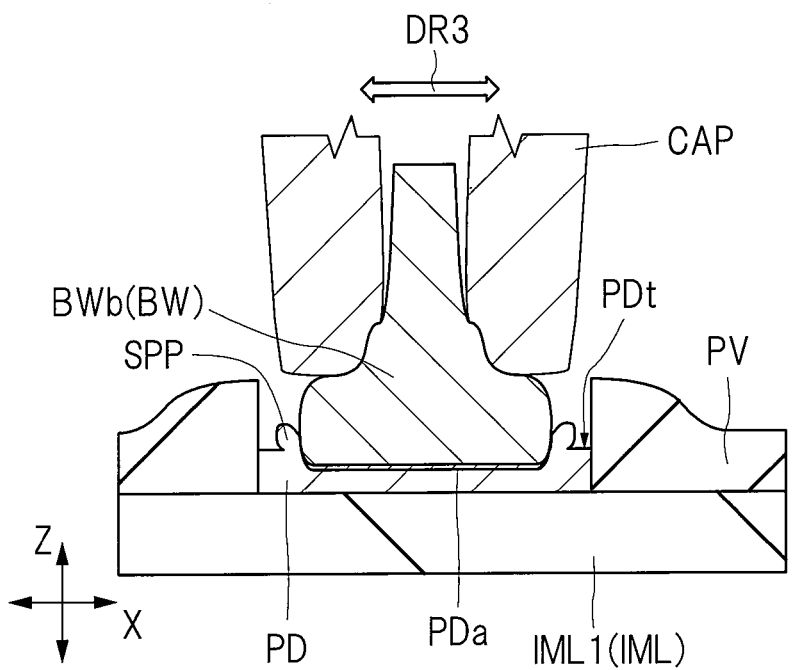
FIG. 25 is an enlarged cross-sectional view taken along a line A-A of FIG. 24.

Note that, in FIG. 22, as the direction DR2, a plurality of double-headed arrows with arrows at both ends are schematically illustrated. "Vibrating the ball portion BWb" means that the ball portion BWb performs reciprocating motion (coming and going on the same line) in directions opposite to each other along a straight line indicated by the double-headed arrow. Then, the reciprocating motion is generated by application of an ultrasonic wave having a certain frequency to the ball portion. A direction DR3 being a double-headed arrow is also illustrated in FIGS. 24 and 25 described below, and this case also illustrates that the ball portion BWb performs reciprocating motion along a straight line indicated by the direction DR3.

In the scrubbing step ST4 (see FIG. 17), various modifications can be applied to a value of the load M2 (see FIG. 17) applied to the ball portion BWb, and in the case of the present embodiment, the load M2 is lower than a load M4 (see FIG. 17) applied in the main bonding step ST6 (see FIG. 17) described below and is, for example, substantially 0.1 N (newtons). If the value of the load M2 applied in the scrubbing step ST4 is small, the stress applied on the periphery of the pad PD during the scrubbing step ST4 can be reduced. Meanwhile, from the viewpoint of easy removal of the metal oxide film, it is preferable that the value of the load M2 is large. According to the study of the inventor of the present application, when the load M2 is equal to the load M4 illustrated in FIG. 17 (for example, substantially 0.15 N (newtons)), damage to the pad PD (see FIG. 23) and the insulating layer IML1 (see FIG. 23) during the scrubbing step ST4 was not confirmed. In addition, when the load M2 illustrated in FIG. 17 is equal to a load M3 (for example, substantially 0.05 N (newtons)) applied in the activation step ST5 described below, it was confirmed that the metal oxide film can be removed.

In addition, as illustrated in FIG. 23, in the scrubbing step ST4 (see FIG. 17), the part of the metallic material constituting the pad PD is discharged to the periphery of the region in close contact with the ball portion BWb. For this reason, the bonding surface PDt of the pad PD comes into a state where the height of the periphery of the region in close contact with the ball portion BWb is raised higher than the height of the region in close contact with the ball portion BWb. A degree to which the height of the periphery of the region in close contact with the ball portion BWb is raised is raised even higher than that during the ball portion deformation step ST3 (see FIG. 17) described above.

In addition, after the scrubbing step ST4, the wire bonding process includes a step of applying ultrasonic waves to the ball portion BWb via the capillary CAP (activation step ST5 illustrated in FIG. 17) while pressing the ball portion BWb of the wire BW against the pad PD with the load M3 (see FIG. 17) smaller than the load M2 (see FIG. 17). In addition, after the activation step ST5, the wire bonding process includes a step (the main bonding step ST6 illustrated in FIG. 17) of applying ultrasonic waves to bond the ball portion BWb and the pad PD together while pressing the ball portion BWb of the wire BW against the pad PD with the load M4 (see FIG. 17) larger than the load M3 and smaller than the load M1 (see FIG. 17).

In other words, in the wire bonding process of the present embodiment, by applying ultrasonic waves with a low load (load M3) first, and then applying the ultrasonic waves continuously with the load raised to a relatively high load M4, the ball portion BWb and the pad PD are bonded together. The activation step ST5 is performed between time $T_5$ and time (timing) $T_6$ illustrated in FIG. 17. In addition, the main bonding step ST6 is performed between time $T_6$ and time (timing) $T_7$ illustrated in FIG. 17.

In the present embodiment, the frequency of the ultrasonic wave applied in the activation step ST5 and the main bonding step ST6 is, for example, substantially 120 kHz (kilohertz). In addition, the length of the period during which the activation step ST5 and the main bonding step ST6 are performed (time $T_7$–time $T_5$) is substantially 10 msec (milliseconds).

According to the study of the inventor of the present application, the wire BW and the pad PD are bonded together by application of high frequency vibration such as ultrasonic vibration with a certain degree of high load applied. In particular, it is difficult to bond the wire BW made of copper and the pad PD made of aluminum together, and during each step of the above-described ball portion contact step ST2, ball portion deformation step ST3, and scrubbing step ST4, almost no alloy layer PDa (see FIG. 14) is formed on the interface where the ball portion BWb and the pad PD are in close contact with each other. In addition, in order to form the alloy layer PDa in a preferable state from the viewpoint of bonding strength or electrical characteristics, as in the present embodiment, a method of starting application of ultrasonic waves with a lower load in advance, and then applying the ultrasonic waves with a higher load was found to be particularly preferable.

In the activation step ST5 (see FIG. 17) of the present embodiment, the load M3 to be applied (see FIG. 17) is, for example, substantially 0.05 N (newtons). Thus, in the case where the load is low when ultrasonic waves are applied, bonding of the ball portion BWb and the pad PD is not started even if ultrasonic waves are applied, and the close contact interface between the ball portion BWb and the pad PD is rubbed to be activated. In addition, since the value of the load M3 in the activation step ST5 is low, the bonding of the ball portion BWb and the pad PD is not started at this stage. In other words, according to the present embodiment, it can be prevented that bonding (formation of the alloy layer PDa (see FIG. 25)) is locally started at a part of the close contact interface between the ball portion BWb and the pad PD. Then, when the load M4 (see FIG. 17) and ultrasonic waves are applied with the entire close contact interface activated, the alloy layer PDa is formed on the entire close contact interface. Therefore, even when the value of the load M4 is not so large, a preferable alloy layer PDa can be obtained. The value of the load M4 is, for example, substantially 0.15 N (newtons).

That is, according to the present embodiment, after the activation step ST5 of applying ultrasonic waves with a load M3 lower than the load M4 applied, the load to be applied to the ball portion BWb are raised, and the load M4 and the ultrasonic waves are applied thereto, so that bonding can be started with the contact interface of the bonding surface PDt and the ball portion BWb uniformly activated. As a result, in the main bonding step ST6, damage to the pad PD and the insulating layer IML1 due to the influence of the stress applied to the pad PD can be prevented. In addition, by performing the activation step ST5 before the main bonding step ST6, good film quality of the alloy layer PDa formed between the ball portion BWb and the pad PD illustrated in FIG. 25 can be obtained. Therefore, even when the load M4 in the main bonding step ST6 is low, sufficient bonding strength can be ensured. In addition, according to the present embodiment, unevenness in density or composition of the alloy layer PDa is unlikely to occur, so that the electrical characteristics at the bonding interface between the wire BW and the pad PD can be stabilized.

In addition, in the present embodiment, the loads M2 and M3 applied in the scrubbing step ST4 and the activation step ST5 illustrated in FIG. 17 are smaller than the load M4. Therefore, the load applied during the ball bonding period (time $T_7$–time $T_1$ illustrated in FIG. 17) can reduce an impulse given to the pad PD (see FIG. 25).

In addition, from the viewpoint of starting the main bonding step ST6 immediately after the bonding surface PDt of the pad PD is activated in the activation step ST5, as illustrated in FIG. 17, it is preferable to perform the main bonding step ST6 with the ultrasonic waves applied in the activation step ST5 continuously applied. However, when it is easy to switch on and off the ultrasonic waves, application of the ultrasonic waves may be temporarily stopped before shifting from the activation step ST5 to the main bonding step ST6.

By the way, the ultrasonic waves applied in the activation step ST5 and the main bonding step ST6 are generated by the oscillator USG of the wire bonding device WBD illustrated in FIGS. 15 and 16. Specifically, the ultrasonic waves US1 oscillated by the oscillator USG are amplified by the horn USH and transmitted to the wire BW via the capillary CAP. In the case of the present embodiment, in the activation step ST5 and the main bonding step ST6, as described above, ultrasonic waves having a frequency of substantially 120 kHz (kilohertz), for example, are applied. In addition, as described above, from the viewpoint of reducing the stress caused by the nonuniform state of the bonding interface, it is preferable to prevent bonding from being started in the scrubbing step ST4. Therefore, it is particularly preferable that, in each step other than the activation step ST5 and the main bonding step ST6, the oscillator USG is turned off and ultrasonic waves are not applied. However, vibrations to such an extent as not to affect the bonding between the ball portion BWb and the pad PD may be applied. For example, in the scrubbing step ST4, vibration having a frequency of substantially 1 Hz (hertz) may be applied to the ball portion BWb. In addition, for example, ultrasonic waves to such an extent as not to contribute to start of the bonding between the ball portion BWb and the bonding surface PDt may be applied, for example, in the scrubbing step ST4 illustrated in FIG. 17. In the scrubbing step ST4, when ultrasonic waves are applied, it is preferable that its frequency is less than half (particularly preferably ¼ or less) of frequency of the ultrasonic waves applied in the activation step ST5 and the main bonding step ST6 described below.

In addition, a vibration direction of the ultrasonic waves applied to the ball portion BWb is limited to one direction for the following reason. Since the ultrasonic wave US1 is a compressional wave (longitudinal wave), it vibrates along the extending direction of the horn USH (X direction in the example illustrated in FIGS. 15 and 16). In addition, as illustrated in FIG. 16, since the capillary CAP is fixed to the horn USH, the vibration direction in the plan view of the ultrasonic wave US1 transmitted to the ball portion BWb via the capillary CAP is the same direction as the extending direction of the horn USH.

In the example illustrated in FIGS. 24 and 25, the direction DR3 being the vibration direction of the ultrasonic wave (the direction reciprocating along the straight line) is the same as the X direction. However, as described above, the vibration direction of the ultrasonic wave is defined by the extension direction of the horn USH illustrated in FIG. 15. Therefore, as a modification of the present embodiment, the direction DR3 being the vibration direction of the ultrasonic wave may be a direction different from the X direction and the Y direction (a direction crossing the X direction and the Y direction).

In addition, when ultrasonic waves are applied to the ball portion BWb, the part of the metallic material constituting the pad PD is discharged to the periphery due to the vibration accompanying the ultrasonic wave, and a splash portion SPP is formed. The splash portion SPP extends in the direction DR3 being the vibration direction of the ultrasonic wave. Therefore, in the example illustrated in FIG. 24, the splash portion SPP extends longer in the X direction than in the Y direction. In addition, the splash portion SPP grows longer due to application of high frequency vibration. Therefore, the portion raised on the periphery of the ball portion BWb is formed even in each of the ball portion deformation step ST3 (see FIG. 17) and the scrubbing step ST4 (see FIG. 17) described above, but the splash portion SPP extends thinner and longer than these raised portions.

In addition, comparing the activation step ST5 (see FIG. 17) with the main bonding step ST6 (see FIG. 17), the smaller the load applied to the ball portion BWb is when ultrasonic waves are applied, the more easily the splash portion SPP grows. Therefore, in the case of the present embodiment, in the activation step ST5, the splash portion SPP grows easily. However, from the following viewpoint, it is preferable to prevent development of the splash portion SPP. That is, when the splash portion SPP grows and the splash portions SPP formed on the adjacent pads PD come into contact with each other, an electrical short circuit is caused. In addition, when an area of the splash portion SPP increases, the splash portion SPP tends to break easily, and when the pad PD and the splash portion SPP are broken to be separated, the splash portion SPP becomes a conductive foreign substance. Therefore, from the viewpoint of improving reliability of the semiconductor device, even if the splash portion SPP is formed, it is preferable to keep the area small.

As a method of preventing growth of the splash portion SPP, a method of reducing a volume of the pad PD serving as a raw material of the splash portion is effective. In the case of the present embodiment, as described above, the thickness THpd (see FIG. 6) of the pad PD is small, for example, not more than the thickness THpv (see FIG. 6) of the insulating film PV covering the pad PD. Thus, according to the present embodiment, since the thickness THpd of the pad PD is small, even if ultrasonic waves are applied in the activation step ST5 with the load M3 (see FIG. 17) being a low load applied, growth of the splash portion SPP can be prevented.

In addition, in the case of the present embodiment, most of the alloy layer PDa illustrated in FIG. 14 is formed in the main bonding step ST6 illustrated in FIG. 17. In other words, until the main bonding step ST6 is started, the ball portion BWb and the pad PD are hardly bonded. Therefore, from the viewpoint of improving bonding strength, the period during which the main bonding step ST6 for forming the alloy layer PDa is performed is preferably long to some extent. In the case of the present embodiment, as illustrated in FIG. 17, the length of the period of the main bonding step ST6 (time $T_6$–time $T_5$) is longer than the length of the period of the activation step ST5 (time $T_5$–time $T_4$). In other words, a time for applying ultrasonic waves in the main bonding step ST6 is longer than a time for applying ultrasonic waves in the activation step ST5. In addition, the length of the period of the main bonding step ST6 (time $T_6$–time $T_5$) is longer than the length of the period of the ball portion deformation step ST3 (time $T_4$–time $T_3$). Thus, increasing the length of the main bonding step ST6 can improve the bonding strength between the ball portion BWb and the pad PD.

The ball portion BWb of the wire BW is bonded to the pad PD by each of the above steps. In the wire bonding process, after the ball portion BWb and the pad PD are bonded, that is, after the main bonding step ST6, a wire loop illustrated in FIG. 10 is formed. In the wire loop, the capillary CAP is moved toward the wire bonding region of the lead LD while the wire BW is fed from the capillary CAP (see FIG. 25). Thereafter, bonding the other end of the wire BW to the upper surface LDt of the lead LD forms the wire BW illustrated in FIG. 10.

MODIFICATIONS

In the foregoing, the invention made by the inventor of the present application has been concretely described based on the embodiment. However, it is needless to say that the present invention is not limited to the foregoing embodiment and various modifications and alterations can be made within the scope of the present invention.

First Modification

Figure 27:
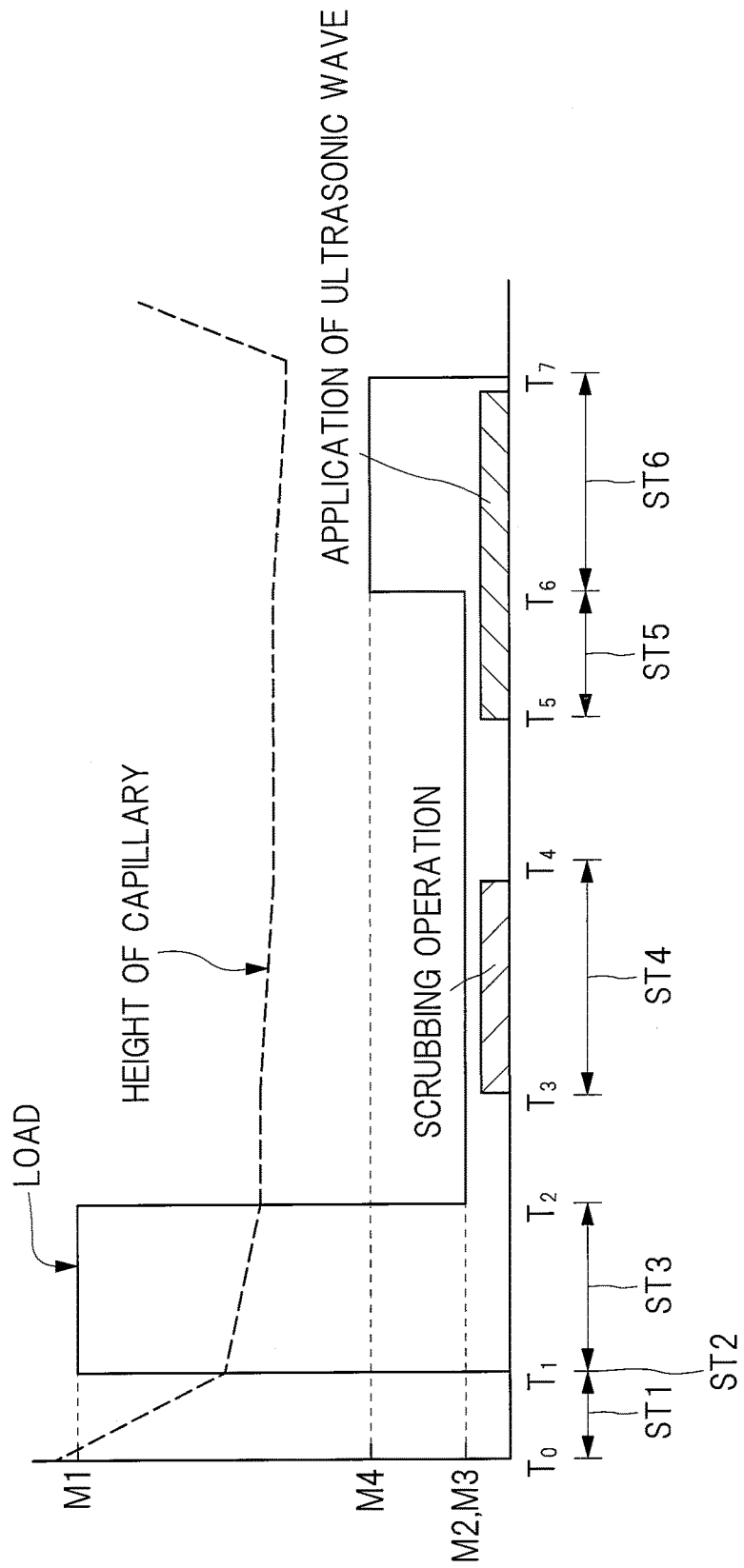
FIG. 27 is a timing chart of another modification of FIG. 17.
Figure 28:
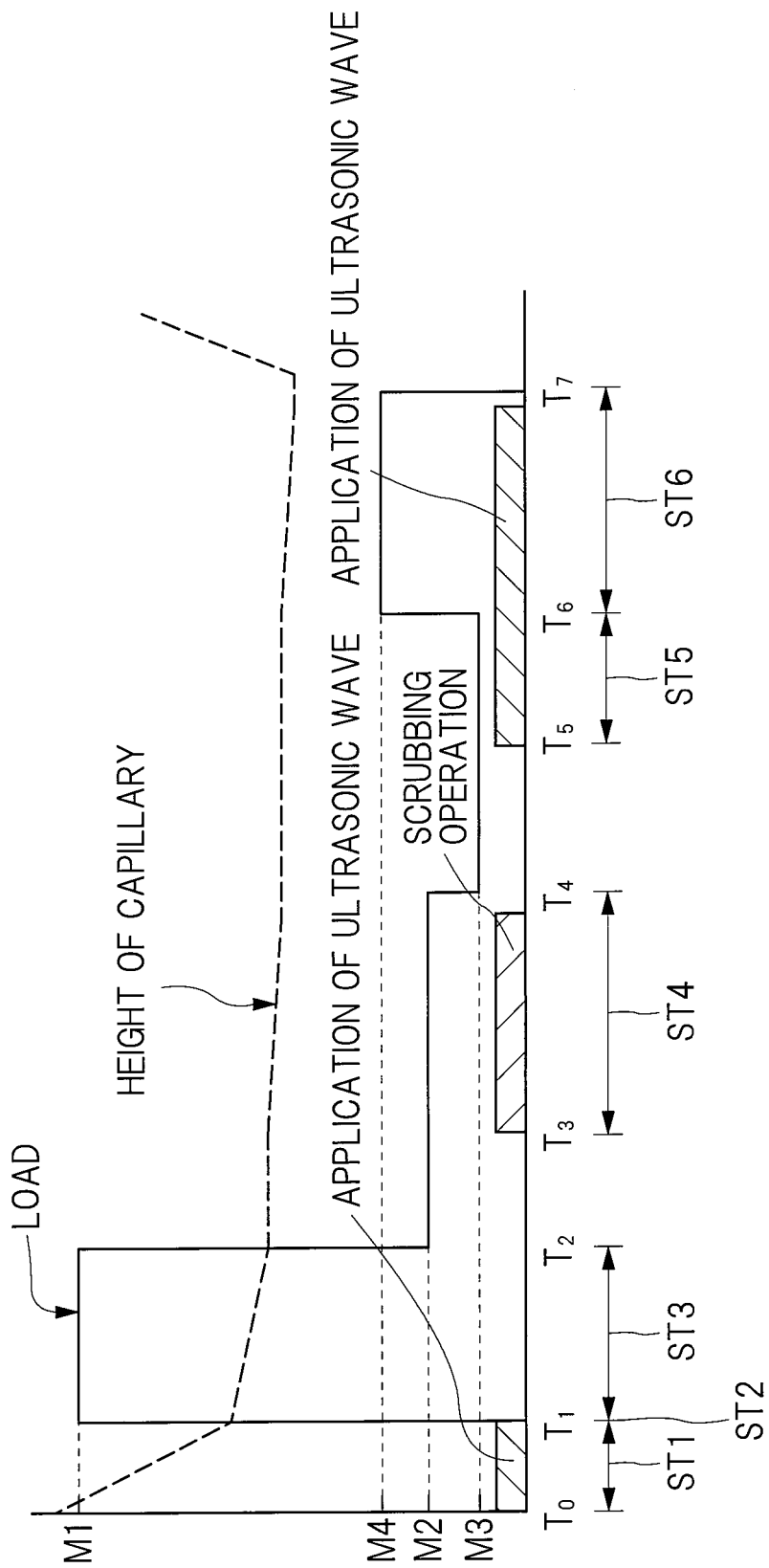
FIG. 28 is a timing chart of still another modification of FIG. 17.

In the above embodiment, the height of the bonding tool, the load applied to the ball portion, presence or absence of the scrubbing operation, and presence or absence of ultrasonic vibration in the ball bonding process have been described with reference to the timing chart illustrated in FIG. 17; however, various modifications can be applied to FIG. 17. Each of FIGS. 26 to 28 is a timing chart being a modification of FIG. 17.

First, in FIG. 17, the mode in which the value of the load M2 applied to the ball portion BWb in the scrubbing step ST4 is larger than the value of the load M3 and smaller than the value of the load M4 has been described. However, the value of the load M2 has various modifications.

Figure 26:
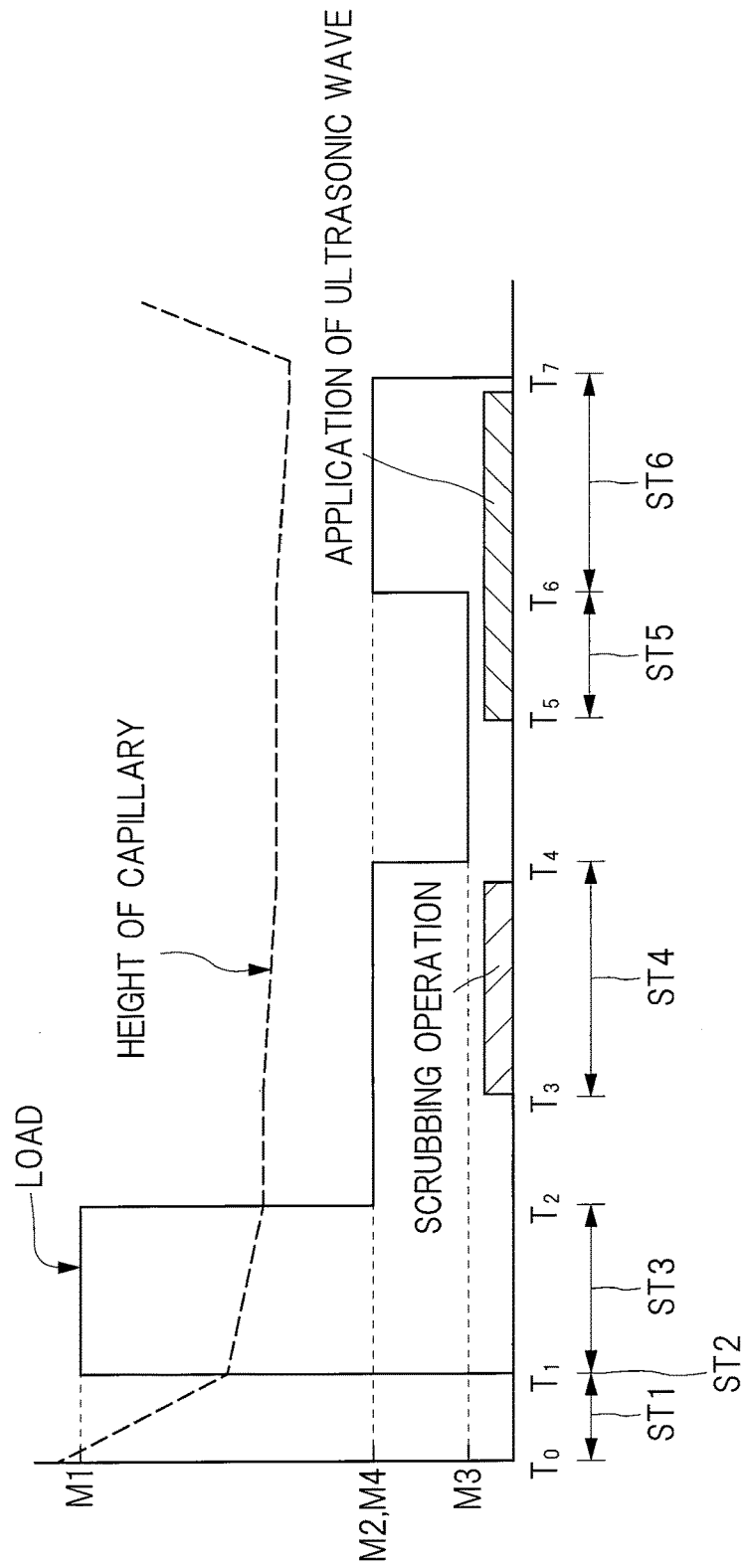
FIG. 26 is a timing chart of a modification of FIG. 17.

For example, as in the modification illustrated in FIG. 26, the value of the load M2 applied to the ball portion BWb (see FIG. 23) in the scrubbing step ST4 may be equal to the value of the load M4 applied to the ball portion BWb (see FIG. 25) in the main bonding step ST6. In the case of a modification illustrated in FIG. 26, the load applied to the ball portion BWb is reduced to the load M3 after the time $T_4$ for completing the scrubbing operation and before the time $T_5$ for applying the ultrasonic waves. Then, after the time $T_5$ for applying the ultrasonic waves, the load applied to the ball portion BWb is increased again to the load M4 equal to the load M2. In this case, in the scrubbing step ST4, since the metal oxide film is removed with use of a load larger than the load in the example illustrated in FIG. 17, the metal oxide film can be removed efficiently. In the examples illustrated in FIGS. 17 and 26, the length of the period during which the scrubbing operation is performed (time $T_4$–time $T_3$) is substantially 5 msec (milliseconds), but the length of this period may be shortened depending on the degree of the removal efficiency of the metal oxide film.

However, when the value of the load M2 increases, the impulse of the load applied to the pad PD increases in the ball bonding process as a whole, and this causes damage to the pad PD (see FIG. 25) or the insulating layer IML1 (see FIG. 25). Therefore, the load M2 is preferably not more than the load M4.

In addition, for example, as in the modification illustrated in FIG. 27, the value of the load M2 applied to the ball portion BWb (see FIG. 23) in the scrubbing step ST4 may be equal to the value of the load M3 applied to the ball portion BWb in the activation step ST5. In the case of a modification illustrated in FIG. 27, at the time $T_2$ when the ball portion deformation step ST3 ends, the value of the load to be transmitted to the ball portion BWb is reduced to the load M2, and thereafter, until the time $T_6$ when the main bonding step ST6 is started, a constant load is continuously applied. In this case, the stress transmitted to the pad PD in the scrubbing step ST4 can be further reduced as compared with the example illustrated in FIG. 17. Therefore, even when the thickness THpd of the pad PD illustrated in FIG. 6 is particularly small (for example, 600 nm or less), damage to the pad PD and the insulating layer IML1 illustrated in FIG. 23 can be prevented.

In addition, the period from the time $T_2$ to the time $T_3$ and the period from the time $T_4$ to the time $T_5$ described in each of FIGS. 17, 26, and 27 are transition periods from end of one step to start of the next step, and these periods may be short. For example, although not illustrated, time $T_2$ and time $T_3$ may be simultaneous.

In addition, in the example illustrated in FIG. 17, ultrasonic waves are applied during a period from time $T_5$ to time $T_7$, and ultrasonic waves are not applied in other periods. However, as a modification of FIG. 17, ultrasonic waves may be applied in a period other than the period from time $T_5$ to time $T_7$.

For example, the modification illustrated in FIG. 28 is different from the mode illustrated in FIG. 17 in that ultrasonic waves are applied also in the period from time $T_0$ to time $T_1$ in addition to the period from time $T_5$ to time $T_7$. The period from the time $T_0$ to the time $T_1$ is a period from the ball portion forming step ST1 to the ball portion contact step ST2 in the wire bonding process described above. Thus, applying ultrasonic waves during the period from the ball portion forming step ST1 to the ball portion contact step ST2 can improve alignment accuracy between the ball portion BWb and the pad PD in a plan view illustrated in FIG. 19.

In addition, although not illustrated, as another modification of FIG. 17, during a period other than the period from time $T_5$ to time $T_7$, ultrasonic waves may be applied at a frequency to such an extent that bonding of the wire BW and the pad PD is not started.

Second Modification

In addition, in the above embodiment, the mode in which each of the plurality of wires BW illustrated in FIG. 3 is made of copper and the pad PD is made of aluminum has been described. However, as described in the above embodiment, when the metallic material constituting the wire BW is harder than the metallic material constituting the pad PD and the pad PD is easily deformed at the time of ball bonding, another metallic material can also be applied. However, when the wire BW is made of gold and the pad PD is made of aluminum, the wire BW and the pad PD bond with each other more easily than the case where the wire BW is made of copper. Therefore, as described in the above embodiment, the case where the wire BW is made of copper is particularly more effective from the viewpoint in that bonding between the wire BW and the pad PD are hardly started up to the main bonding step ST6.

Third Modification

In addition, in the above embodiment, as described with reference to FIG. 6, the case where the thickness THpd of the pad PD is small (for example, 1 μm or less) has been described. However, for example, even when the thickness THpd of the pad PD is greater than the thickness THpv of the insulating film PV covering the pad PD, the wire bonding process described in the above embodiment can be applied. However, since the splash portion SPP (see FIG. 25) grows more easily compared to the mode described in the above embodiment, measures to prevent growth of the splash portion SPP such as shortening the period of the activation step ST5 are required.

Fourth Modification

Figure 29:
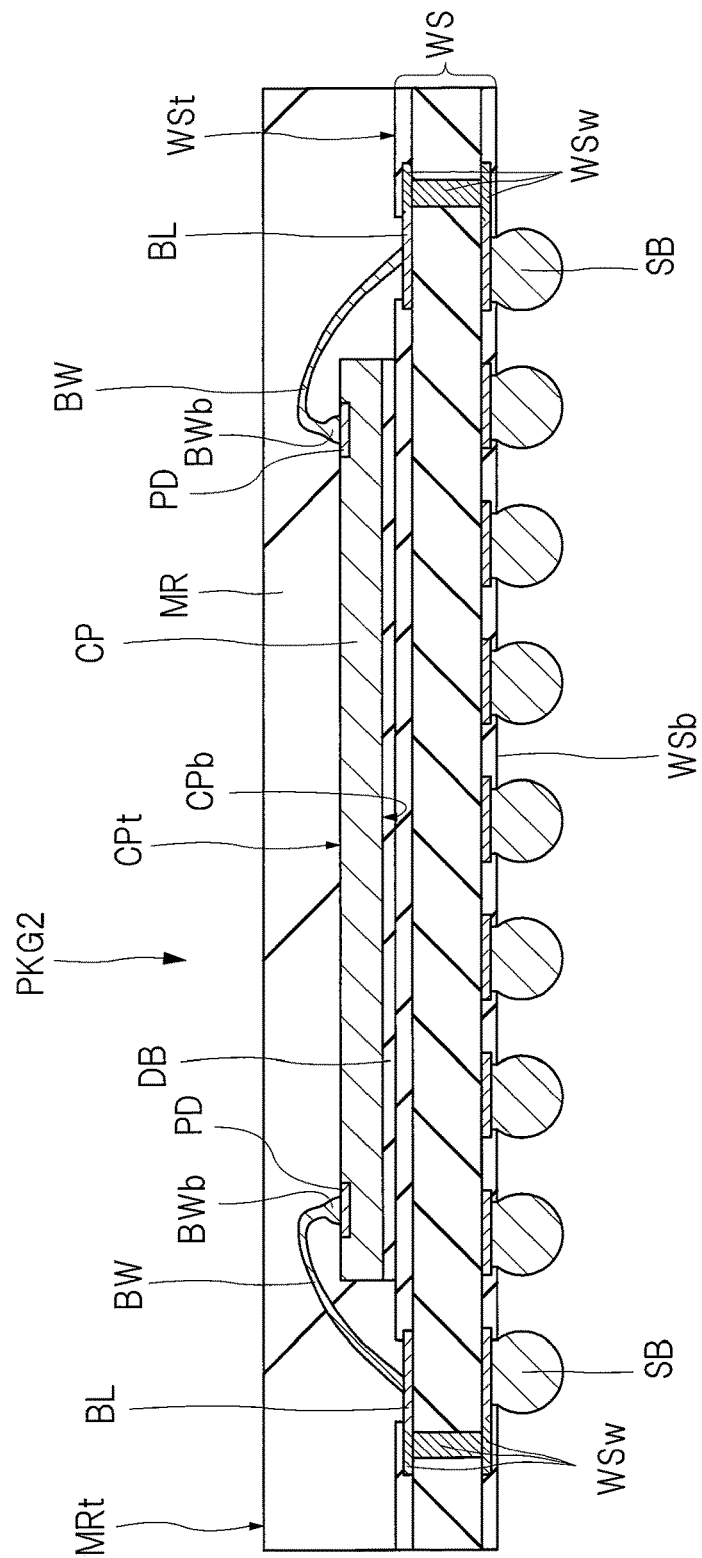
FIG. 29 is a cross-sectional view of a semiconductor device being a modification of FIG. 2.

In addition, for example, in the above-described embodiment, a lead-frame type semiconductor device has been described as an example of a semiconductor device in which the pad PD of the semiconductor chip CP and the ball portion BWb of the wire BW are bonded together; however, the mode of the semiconductor device has various modifications. For example, as in a semiconductor device PKG2 illustrated in FIG. 29, the present invention can also be applied to an area-array type semiconductor device in which the semiconductor chip CP is mounted over a wiring substrate (base material) WS. FIG. 29 is a cross-sectional view of a semiconductor device being a modification of FIG. 2. The area-array type semiconductor device is a semiconductor device in which external terminals disposed on a mounting surface are arrayed in an array (also referred to as a matrix). Like the semiconductor device PKG2 illustrated in FIG. 29, the area-array type semiconductor device includes a ball grid array (BGA) in which solder balls SB as external terminals are formed on a lower surface WSb being the mounting surface of the wiring substrate WS, for example.

In the case of the semiconductor device PKG2, the ball portion BWb being one end of the wire BW is connected to the pad PD of the semiconductor chip CP, and the other end is connected to a bonding lead (terminal) BL exposed on an upper surface WSt side of the wiring substrate WS. The bonding lead BL is connected with the solder ball SB being the external terminal via a wiring WSw provided in the wiring substrate WS.

In addition, in the case of the method of manufacturing the semiconductor device PKG2, in the base material preparation process illustrated in FIG. 7, instead of the lead frame LF (see FIG. 8) described in the above embodiment, the wiring substrate WS is prepared. In addition, in the die bonding process illustrated in FIG. 7, the semiconductor chip CP is mounted over the upper surface (main surface) WSt being the chip mounting surface of the wiring substrate WS via the die bonding material DB. In addition, in the wire bonding process illustrated in FIG. 7, the ball portion BWb being one end of the wire BW is connected to the pad PD of the semiconductor chip CP, and the other end is connected to the bonding lead BL exposed on the upper surface WSt side of the wiring substrate WS. In addition, in the sealing process illustrated in FIG. 7, each of the semiconductor chip CP, the plurality of wires BW, and the plurality of bonding leads BL mounted over the upper surface WSt of the wiring substrate WS is sealed with the sealing body MR. In contrast, the lower surface WSb side of the wiring substrate WS is not sealed and is exposed from the sealing body MR. In addition, the plating process and the lead cutting process illustrated in FIG. 7 are omitted, and instead, a ball mounting process in which a plurality of solder balls SB are mounted on the lower surface WSb side of the wiring substrate WS is performed.

Fifth Modification

In addition, it is possible to apply the modifications in combination within the scope of the technical idea that has been described in the above-described embodiment.

Further, it is possible to apply each embodiment described above in combination or each modification that has been described in each embodiment in combination within the scope of the technical idea that has been described in the above-described embodiment.

What is claimed is:

1. A method of manufacturing a semiconductor device, the method comprising the steps of:
   (a) preparing a semiconductor chip having an insulating film, and a first main surface in which a plurality of electrodes respectively exposed in a plurality of openings formed in the insulating film are formed;
   (b) preparing a base material including a second main surface over which the semiconductor chip is mounted, and a plurality of terminals;
   (c) after the step (a) and the step (b), mounting the semiconductor chip over the second main surface of the base material;
   (d) after the step (c), electrically connecting the plurality of electrodes and the plurality of terminals via a plurality of wires, respectively; and
   (e) after the step (d), resin-sealing the semiconductor chip and the plurality of wires,
   wherein, in the step (a),
   each of the plurality of electrodes of the semiconductor chip includes a first electrode having a first bonding surface exposed in a first opening among the plurality of openings, and
   in a plan view, each of the plurality of openings of the semiconductor chip has a plurality of sides including a first side extending in a first direction and a second side extending in a second direction intersecting the first direction, and
   wherein the step (d) includes the steps of:
   (d1) bringing a ball portion of a first wire among the plurality of wires into contact with the first bonding surface of the first electrode;
   (d2) after the step (d1), pressing the ball portion of the first wire toward the first bonding surface with a first load;
   (d3) after the step (d2), moving the ball portion of the first wire in a plurality of directions including two directions crossing each other in a plan view while pressing the ball portion against the first electrode with a second load smaller than the first load;
   (d4) after the step (d3), by applying a first ultrasonic wave having a first frequency to the ball portion of the first wire while pressing the ball portion against the first electrode with a third load equal to the second load or smaller than the second load, making the ball portion reciprocate along a third direction in a plan view; and
   (d5) after the step (d4), by applying the first ultrasonic wave having the first frequency while pressing the ball portion of the first wire against the first electrode with a fourth load larger than the third load and smaller than the first load, making the ball portion reciprocate along the third direction in a plan view, thereby bonding the ball portion and the first electrode.

2. The method of manufacturing a semiconductor device according to claim 1,
   wherein the third direction is different from the first direction and the second direction.

3. The method of manufacturing a semiconductor device according to claim 2,
   wherein, in each of the step (d4) and the step (d5), while the ball portion is reciprocated along only the third direction, the first ultrasonic wave is applied to the ball portion.

4. The method of manufacturing a semiconductor device according to claim 1,
   wherein, in the step (d3), in a plan view, the ball portion is reciprocated along each of the two directions.

5. The method of manufacturing a semiconductor device according to claim 1,
   wherein the first ultrasonic wave having the first frequency is continuously applied during a period from the step (d4) to the step (d5).

6. The method of manufacturing a semiconductor device according to claim 1,
   wherein, in the step (d3), ultrasonic waves are not applied.

7. The method of manufacturing a semiconductor device according to claim 1,
   wherein, in the step (d3), while the ball portion of the first wire is pressed against the first electrode with the second load smaller than the first load, and while the ball portion is moved in the plurality of directions including the two directions different from each other in a plan view, a second ultrasonic wave having a second frequency not more than ¼ of the first frequency is applied.

8. The method of manufacturing a semiconductor device according to claim 1,
   wherein time for applying the first ultrasonic wave in the step (d5) is longer than time for applying the first ultrasonic wave in the step (d4).

9. The method of manufacturing a semiconductor device according to claim 1,
   wherein the second load applied in the step (d4) is equal to the fourth load.

10. The method of manufacturing a semiconductor device according to claim 1,
    wherein the second load applied in the step (d4) is equal to the third load.

11. The method of manufacturing a semiconductor device according to claim 1,
    wherein the first electrode has a first back surface positioned opposite to the first bonding surface, and
    wherein, in a fourth direction from one to another of the first bonding surface and the first back surface, a thickness of the first electrode before the ball portion is bonded is smaller than a thickness of a portion covering a part of the first electrode of the insulating film.

12. The method of manufacturing a semiconductor device according to claim 1,
    wherein the first electrode is made of a metallic material containing aluminum as a main component, and
    wherein the first wire is made of a metallic material containing copper as a main component.

13. The method of manufacturing a semiconductor device according to claim 1,
    wherein the first electrode has a first back surface positioned opposite to the first bonding surface, and
    wherein a first insulating layer greater than the first electrode in thickness is formed on a side of the first back surface of the first electrode.

14. The method of manufacturing a semiconductor device according to claim 1,
    wherein, in the step (d3), a metal oxide film formed on the first bonding surface of the first electrode is removed.

15. The method of manufacturing a semiconductor device according to claim 1,
    wherein, in the step (d5), an alloy layer is formed on a bonding interface between the ball portion and the first electrode.

16. The method of manufacturing a semiconductor device according to claim 1,
wherein, in the step (d2), the ball portion is deformed.

* * * * *